(12) United States Patent
Yokokawa et al.

(10) Patent No.: US 8,010,870 B2
(45) Date of Patent: *Aug. 30, 2011

(54) CODING APPARATUS AND CODING METHOD

(75) Inventors: Takashi Yokokawa, Kanagawa (JP); Makiko Yamamoto, Tokyo (JP); Misa Nakane, Tokyo (JP)

(73) Assignee: Sony Corporation, Tokyo (JP)

( * ) Notice: Subject to any disclaimer, the term of this patent is extended or adjusted under 35 U.S.C. 154(b) by 461 days.

This patent is subject to a terminal disclaimer.

(21) Appl. No.: 11/912,485

(22) PCT Filed: Apr. 25, 2005

(86) PCT No.: PCT/JP2006/308302
§ 371 (c)(1),
(2), (4) Date: Feb. 24, 2009

(87) PCT Pub. No.: WO2006/115166
PCT Pub. Date: Nov. 2, 2006

(65) Prior Publication Data
US 2009/0217122 A1 Aug. 27, 2009

(30) Foreign Application Priority Data
Apr. 25, 2005 (JP) .................. 2005-125965

(51) Int. Cl.
*H03M 13/00* (2006.01)
(52) U.S. Cl. ........................ 714/758; 714/701
(58) Field of Classification Search .................. 714/758, 714/701
See application file for complete search history.

(56) References Cited

U.S. PATENT DOCUMENTS 6,633,856 B2 * 10/2003 Richardson et al. ............ 706/15
6,757,122 B1 * 6/2004 Kuznetsov et al. ............. 360/53
(Continued)

FOREIGN PATENT DOCUMENTS
JP 2004-364233 12/2004
(Continued)

OTHER PUBLICATIONS
Search Report in European Application No. EP 06 74 5483 (Mar. 22, 2010).
(Continued)

*Primary Examiner* — M. Mujtaba K Chaudry
(74) *Attorney, Agent, or Firm* — Finnegan, Henderson, Farabow, Garrett & Dunner, LLP

(57) ABSTRACT

The present invention relates to a coding apparatus and a coding method by which the circuit scale can be reduced without changing the operation speed in coding of a linear code. An adder 13 integrates the product of an information word D13 of six bits supplied from a cyclic shift circuit 12 and the information part of a check matrix H corresponding to the information for each row in a unit of six rows and supplies the integrated value as a sum D15 to a RAM 14. The RAM 14 stores the sum D15. Further, the RAM 14 successively reads out sums D16 of 2 bits stored already therein and supplies the read out sums D16 as sums D17 to an accumulator 16 through an interleaver 15. The accumulator 16 integrates the sums D17 and outputs a sum D18 obtained as a result of the integration as a parity bit p of a codeword c through a selector 17. The present invention can be applied to an apparatus of a broadcasting station which transmits a satellite broadcast.

19 Claims, 27 Drawing Sheets

U.S. PATENT DOCUMENTS

| | | | |
|---|---|---|---|
| 6,895,547 B2 * | 5/2005 | Eleftheriou et al. | 714/801 |
| 6,898,248 B1 * | 5/2005 | Elgamal et al. | 375/259 |
| 7,181,676 B2 * | 2/2007 | Hocevar | 714/780 |
| 7,260,763 B2 * | 8/2007 | Sukhobok et al. | 714/758 |
| 7,313,752 B2 * | 12/2007 | Kyung et al. | 714/801 |
| 7,349,478 B2 * | 3/2008 | Lakkis | 375/240.27 |
| 7,395,494 B2 * | 7/2008 | Lee et al. | 714/801 |
| 7,406,647 B2 * | 7/2008 | Lakkis | 714/758 |
| 7,415,061 B2 * | 8/2008 | Currivan et al. | 375/144 |
| 7,543,212 B2 * | 6/2009 | Miles et al. | 714/752 |
| 2005/0278604 A1 * | 12/2005 | Yokokawa et al. | 714/758 |

FOREIGN PATENT DOCUMENTS

| | | |
|---|---|---|
| JP | 2005-051461 | 2/2005 |
| WO | WO 2004/019268 A1 | 3/2004 |
| WO | WO 2004/102811 A1 | 11/2004 |
| WO | WO 2006/020460 A2 | 2/2006 |
| WO | WO 2006/055249 A2 | 5/2006 |

OTHER PUBLICATIONS

R. Echard et al., "The π-Rotation Low-Density Parity Check Codes," Proc. IEEE Global Telecommunications Conference, GlobeCom 2001, pp. 980-984 (Nov. 25, 2001).

D. Haley et al., "Iterative Encoding of Low-Density Parity-Check Codes," Proc. IEEE Global Telecommunications Conference, GlobeCom 2002, vol. 2, pp. 1289-1293 (Nov. 17, 2002).

* cited by examiner

FIG. 3
-- PRIOR ART --

$$H = \begin{bmatrix} h_{0,0} & h_{0,1} & \cdots & h_{0,k-1} & \vdots & 1 & 0 & 0 & \cdots & 0 \\ h_{1,0} & h_{1,1} & \cdots & h_{1,k-1} & \vdots & h_{1,k} & 1 & 0 & \cdots & 0 \\ \cdot & \cdot & & \cdot & \vdots & \cdot & \cdot & \cdot & & \cdot \\ \cdot & \cdot & & \cdot & \vdots & \cdot & \cdot & \cdot & & \cdot \\ h_{n-k-1,0} & h_{n-k-1,1} & \cdots & h_{n-k-1,k-1} & \vdots & h_{n-k-1,k} & \cdots & \cdots & h_{n-k-1,n-2} & 1 \end{bmatrix}$$

$\underbrace{\qquad\qquad\qquad\qquad}_{\text{INFORMATION PART}}$  $\underbrace{\qquad\qquad\qquad\qquad}_{\text{PARITY PART}}$

INFORMATION PART

PARITY PART

| | 0 | 1 | 2 | 3 | 4 | 5 | 6 | 7 | 8 | 9 | 10 | 11 |
|---|---|---|---|---|---|---|---|---|---|---|---|---|
| 0 | 0 | — | — | — | 1 | 3 | 0 | — | 1 | — | 3 | 2 |
| 1 | 2,4 | 0,5 | — | — | — | — | — | 0 | 3 | — | — | 4 |
| 2 | — | 1 | 0,5 | 0 | 1 | — | 3 | — | 0 | — | — | — |
| 3 | 3 | — | 0,4 | 0 | — | — | 0 | — | — | 0,3 | — | — |
| 4 | — | 0,3 | — | — | 0 | 3 | — | 4 | — | — | 0,1 | — |
| 5 | 5 | — | 1 | 0 | — | 0 | — | 2 | — | 0 | — | 0 |

FIG. 11

| | 0th ADDRESS | 1st ADDRESS | 2nd ADDRESS | 3rd ADDRESS | 4th ADDRESS | 5th ADDRESS |
|---|---|---|---|---|---|---|
| 0th BIT | o0,0 | o0,1 | o0,2 | o0,3 | o0,4 | o0,5 |
| 1st BIT | o1,0 | o1,1 | o1,2 | o1,3 | o1,4 | o1,5 |
| 2nd BIT | o2,0 | o2,1 | o2,2 | o2,3 | o2,4 | o2,5 |
| 3rd BIT | o3,0 | o3,1 | o3,2 | o3,3 | o3,4 | o3,5 |
| 4th BIT | o4,0 | o4,1 | o4,2 | o4,3 | o4,4 | o4,5 |
| 5th BIT | o5,0 | o5,1 | o5,2 | o5,3 | o5,4 | o5,5 |

WORD DIRECTION →

BIT DIRECTION →

| | 0th ADDRESS | 1st ADDRESS | 2nd ADDRESS | 3rd ADDRESS | 4th ADDRESS | 5th ADDRESS |
|---|---|---|---|---|---|---|
| 0th BIT | o0,0 | o4,1 | o2,2 | o0,3 | o4,4 | o2,5 |
| 1st BIT | o1,0 | o5,1 | o3,2 | o1,3 | o5,4 | o3,5 |
| 0th BIT | o2,0 | o0,1 | o4,2 | o2,3 | o0,4 | o4,5 |
| 1st BIT | o3,0 | o1,1 | o5,2 | o3,3 | o1,4 | o5,5 |
| 0th BIT | o4,0 | o2,1 | o0,2 | o4,3 | o2,4 | o0,5 |
| 1st BIT | o5,0 | o3,1 | o1,2 | o5,3 | o3,4 | o1,5 |

104–1, 104–2, 104–3

WORD DIRECTION

BIT DIRECTION

|  | 0th ADDRESS | 1st ADDRESS | 2nd ADDRESS | 3rd ADDRESS |
|---|---|---|---|---|
| 0th BIT | c0,0 | c2,1 | c1,2 | c0,3 |
| 1st BIT | c3,0 | c5,1 | c4,2 | c3,3 |
| 0th BIT | c1,0 | c0,1 | c2,2 | c1,3 |
| 1st BIT | c4,0 | c3,1 | c5,2 | c4,3 |
| 0th BIT | c2,0 | c1,1 | c0,2 | c2,3 |
| 1st BIT | c5,0 | c4,1 | c3,2 | c5,3 |

WORD DIRECTION →

BIT DIRECTION →

104-1, 104-2, 104-3, 104

CODING APPARATUS AND CODING METHOD

TECHNICAL FIELD

This invention relates to a coding apparatus and a coding method, and more particularly to a coding apparatus and a coding method for linearly encoding predetermined information.

BACKGROUND ART

In recent years, research in a communication field for example, for mobile communication, deep space communication and so forth or a broadcasting field for ground wave broadcasting, satellite digital broadcasting and so forth is being advanced remarkably. Together with this, also research relating to coding theories is being advanced energetically in order to achieve improvement in efficiency in error correct on coding and decoding.

As a theoretical limit to the code performance, the Shannon limit given by the channel coding theory of Shannon (C. E. Shannon) is known. Research relating to the coding theory is performed in order to develop a code which indicates a performance proximate to the Shannon limit. In recent years, as a coding method which indicates a performance proximate to the Shannon limit, a technique called turbo coding (Turbo coding) such as, for example, parallelly concatenated convolutional coding (PCCC (Parallel Concatenated Convolutional Codes)) or serially concatenated convolutional coding (SCCC (Serially Concatenated Convolutional Codes)) has been developed. Further, while those turbo coding methods are developed, low density parity check coding (Low Density Parity Check Codes) (such a code is hereinafter referred to as LDPC code) which is a coding method known for long time is being placed into the spotlight.

An LDPC code was proposed first in Non-Patent Document 1 by R. G. Gallager, and thereafter attracted attention again in Non-Patent Document 2, Non-Patent Document 3 and so forth.

It is becoming clear by research in recent years that, as well as the turbo codes and so on, with the LDPC code, a performance proximate to the Shannon limit is obtained by increasing the code length. Further, since the LDPC code has a nature that the minimum distance increases in proportion to the code length, the LDPC code has a characteristic that it is good in block error probability property and is advantageous also in that an error floor phenomenon which is observed in a decoding property of the turbo coding and so forth little occurs.

In the following, such an LDPC code as described above are described more particularly. It is to be noted that, although the LDPC code is a linear code and need not necessarily be two-dimensional codes, the following description is given on the assumption that the LDPC code is a two-dimensional code.

The LDPC code has the most significant characteristic in that a check matrix (parity check matrix) which defines the LDPC code is sparse. Here, a sparse matrix is a matrix wherein the number of "1s" in the components is very small. If a sparse check matrix is represented by H, then such a check matrix H as just described may be a matrix wherein, for example, as seen in FIG. 1, the Hamming weight (number of "1s") (weight) of each column is "3" and the Hamming weight of each row is "6" or the like.

An LDPC code defined by a check matrix H wherein the Hamming weight of the rows and the columns is fixed in this manner is called regular LDPC code. Meanwhile, an LDPC code defined by a check matrix H wherein the Hamming weight of the rows and the columns is not fixed are called irregular LDPC codes.

Coding into such an LDPC code is implemented by generating a generator matrix G based on a check matrix H and multiplying the generator matrix G by two-dimensional information word i to generate a codeword. More particularly, a coding apparatus for coding into an LDPC code first calculates a generator matrix G which satisfies an expression $GH^T=0$ with regard to a transposed matrix $H^T$ of a check matrix H. Here, where the generator matrix G is a k×n matrix (matrix of k rows and n columns), the check matrix H is a matrix of n−k rows and n columns.

It is to be noted that, for example, in the case of an organization code wherein a codeword c of n bits coincides with a bit string wherein a parity bit p of n−k bits is disposed following an information word i of k bits, where a portion of n−k rows and k columns corresponding to the information word i of k bits from within the codeword c of n bits in a check matrix H of n−k rows and k columns is called information part and another portion of n−k rows and n−k columns corresponding to the parity bit p of n−k bits is called parity part, coding of the information word i into an LDPC code can be performed using the check matrix H if the parity part is an upper triangle code or a lower triangle code.

In particular, if it is assumed that, for example, as shown in FIG. 2, the check matrix H is formed from a parity part of a lower triangle matrix and all of the components of the lower triangle portion of the parity part are 1, then the zeroth bit of the parity bit p of the codeword c exhibits a value obtained by arithmetic operation of EXOR (exclusive ORing) of bits which correspond to those elements which have the value 1 in the zeroth row of the information part of the check matrix H in the information word i.

Further, the first bit of the parity bit p of the codeword c has a value obtained by arithmetic operation of EXOR of bits corresponding to those elements which have the value 1 in the first row of the information part of the check matrix H of the information word i and the zeroth bit of the parity bit p.

Further, the second bit of the parity bit p of the codeword c has a value obtained by arithmetic operation of EXOR of those bits which have the value 1 in the second row of the information part of the check matrix H of the information word i and the zeroth bit and the first bit of the parity bit p.

Similarly, the mth bit of the parity bit p of the codeword c has a value obtained by arithmetic operation of EXOR of those bits which have the value 1 in the mth row of the information part of the check matrix H of the information word i and the zeroth to m−1th bits of the parity bit p.

The codeword c of n bits can be obtained by determining the parity bit p of n−k bits and disposing the determined parity bit p following the information word i of k bits in such a manner as described above.

In particular, if a check matrix H whose parity part is a lower triangle matrix is generalized as seen in FIG. 3, then coding of the Information word i into an LDPC code is performed in the following manner using the check matrix H.

In FIG. 3, the components of the zeroth row (uppermost row) of the check matrix H include $h_{0,0}, h_{0,1}, \ldots, h_{0,k-1}$ in the information part and $1, 0, \ldots, 0$ in the parity part in order from the zeroth column (leftmost column). Meanwhile, the components of the first row include $h_{1,0}, h_{1,1}, \ldots, h_{1,k-1}$ in the information part and $h_{1,k}, 1, \ldots, 0$ in the parity part in order from the zeroth column. Similarly, the components of the n−k−1th row (lowermost row) include $h_{n-k-1,0}, h_{n-k-1,1}, \ldots, h_{n-k-1,k-1}$ in the information part and $h_{n-k-1,k}, \ldots, h_{n-k-1,n-2}, 1$ in the parity part in order from the zeroth column.

Here, the information word i of k bits is represented as $i_0, i_1, \ldots, i_{k-1}$ and the parity bit p of n−k bits are represented as $p_0, p_1, \ldots, p_{n-k-1}$. In other words, the codeword c is represented as $i_0, i_1, \ldots, i_{k-1}, p_0, p_1, \ldots, p_{n-k-1}$. Since the exclusive OR of the products of the codeword c and the rows of the check matrix H is 0, arithmetic operation of the products of the codeword c and the zeroth row of the check matrix H is represented by the following expression (1).

[Expression 1]

$$h_{0,0}i_0 + h_{0,1}i_1 + \ldots + h_{0,k-1}i_{k-1} + p_0 = 0 \pmod 2 \quad (1)$$

Accordingly, the parity bit $p_0$ is represented by the following expression (2).

[Expression 2]

$$p_0 = \sum_{j=0}^{k-1} h_{0,j} i_j \pmod 2 \quad (2)$$

Arithmetic operation of the product of the codeword c and the first row of the check matrix H is represented by the following expression (3).

[Expression 3]

$$h_{1,0}i_0 + h_{1,1}i_1 + \ldots + h_{1,k-1}i_{k-1} + h_{1,k}p_0 + p_1 = 0 \pmod 2 \quad (3)$$

Accordingly, the parity bit $p_1$ is represented by the following expression (4).

[Expression 4]

$$p_1 = \sum_{j=0}^{k-1} h_{1,j} i_j + h_{1,k} p_0 \pmod 2 \quad (4)$$

Similarly, the arithmetic operation of the product of the codeword c and the n−k−1th row of the check matrix H is represented by the following expression (5):

[Expression 5]

$$h_{n-k-1,0}i_0 + h_{n-k-1,1}i_1 + \ldots + h_{n-k-1,k-1}i_{k-1} + h_{n-k-1,k}p_0 + h_{n-k-1,k+1}p_1 + \ldots + h_{n-k-1,n-k-2}p_{n-k-2} + p_{n-k-1} = 0 \pmod 2 \quad (5)$$

Accordingly, the parity bit $p_{n-k-1}$ is represented by the following expression (6).

[Expression 6]

$$p_{n-k-1} = \sum_{j=0}^{k-1} h_{n-k-1,j} i_j + \sum_{j=2}^{n-k-2} h_{n-k-1,k+j} p_j \pmod 2 \quad (6)$$

The codeword c of n bits can be obtained by determining the parity bit $p_0, p_1, \ldots, p_{n-k-1}$ of n−k bits and disposing the determined parity bit following the information word $i_0, i_1, \ldots, i_{k-1}$ of k bits in such a manner as described above.

In recent years, research also regarding a mounting method of a coding apparatus for an LDPC code has been and is being carried out, and a method of mounting a coding apparatus using a shift register and a method of mounting a coding apparatus using a RAM (Random Access Memory) in place of a shift register are available.

[Non-Patent Document 1] R. G. Gallager, "Low Density Parity Check Codes", Cambridge, Mass.: M. I. T. Press, 1963

[Non-Patent Document 2] D. J. C. MacKay, "Good error correcting codes based on very sparse matrices", Submitted to IEEE Trans. Inf. Theory, IT-45, pp. 399-431, 1999

[Non-Patent Document 3] M. G. Luby, M. Mitzenmacher, M. A. Shokrollahi and D. A. Spielman, "Analysis of low density codes and improved designs using irregular graphs", Proceedings of the thirtieth annual ACM Symposium on Theory of Computing (STOC), 1998, pp. 249-258

DISCLOSURE OF INVENTION

Problems to be Solved by the Invention

However, in a coding apparatus for an LDPC code mounted using a shift register, a shift register formed from a number of registers equal to the number of bits (information length) of an information word i is mounted, and it includes, where the information length is great, a great number of gates of registers (flip-flops). For example, where the number of gates per one flip-flop is 9 and the information length is 60,000, the total number of gates of the flip-flops which form the coding apparatus is 540,000 (=9×60,000) exceeding 500,000. As a result, the coding apparatus has an increased circuit scale.

Meanwhile, in a coding apparatus for an LDPC code mounted using a RAM, the number of data to be read out from the RAM or the address differs depending upon the code length, coding rate and so forth of (a codeword c of) an LDPC code and it is difficult to obtain (a codeword c of) an LDPC code of different parameters such as the code length, coding rate and so forth using a single coding apparatus. Further, the structure of the RAM is not suitable for parallel inputting or outputting of data.

The present invention has been made in view of such situations as described above and makes it possible to reduce the circuit scale of a coding apparatus without changing the operation speed in coding of an LDPC code.

Means for Solving the Problems

According to one embodiment of the present invention, there is provided a coding apparatus. The apparatus includes, where a check matrix for a linear code is represented by a combination of a plurality of component matrices while a unit matrix of P×P, a quasi unit matrix which is a matrix wherein one or more of those components of the unit matrix which are 1 are changed into 0, a shift matrix which is a matrix formed by cyclically shifting the unit matrix or the quasi unit matrix, a sum matrix which is the sum of a plurality of ones of the unit matrix, quasi unit matrix and shift matrix or a 0 matrix of P×P is one of the component matrices, or where the check matrix for the linear code is represented by a combination of a plurality of component matrices by permutation of rows and/or columns, first integration means for integrating the product of information and the information part of the check matrix corresponding to the information for each row in a unit of a plurality of rows. The apparatus further includes storage means for storing a first integration value obtained as a result of the integration by the first integration means, and second integration means for integrating first integration values read out from the storage means and output a second integration value obtained by the integration as part of the linear code.

According to the present invention, there is provided a coding method including, where a check matrix for a linear code is represented by a combination of a plurality of component matrices while a unit matrix of P×P, a quasi unit matrix which is a matrix wherein one or more of those components of the unit matrix which are 1 are changed into 0, a shift matrix which is a matrix formed by cyclically shifting the unit matrix or the quasi unit matrix, a sum matrix which is the sum of a plurality of ones of the unit matrix, quasi unit matrix and shift matrix or a 0 matrix of P×P is one of the component matrices, or where the check matrix for the linear code is represented by a combination of a plurality of component matrices by permutation of rows and/or columns, a first integration step of integrating the product of information and the information part of the check matrix corresponding to the information for each row in a unit of a plurality of rows. The coding method further includes a storage control step of causing a first integration value obtained as a result of the integration by the process at the first integration step to be stored into storage means, and a second integration step of integrating first integration values read out from the storage means and outputting a second integration value obtained by the integration as part of the linear code.

In the present invention, where a check matrix for a linear code is represented by a combination of a plurality of component matrices while a unit matrix of P×P, a quasi unit matrix which is a matrix wherein one or more of those components of the unit matrix which are 1 are changed into 0, a shift matrix which is a matrix formed by cyclically shifting the unit matrix or the quasi unit matrix, a sum matrix which is the sum of a plurality of ones of the unit matrix, quasi unit matrix and shift matrix or a 0 matrix of P×P is one of the component matrices, or where the check matrix for the linear code is represented by a combination of a plurality of component matrices by permutation of rows and/or columns, the product of information and the information part of the check matrix corresponding to the information are integrated for each row in a unit of a plurality of rows. Then, a first integration value obtained as a result of the integration by the process at the first integration step is stored into the storage means. Then, first integration values read out from the storage means are integrated, and a second integration value obtained by the integration is outputted as part of the linear code.

Effect of the Invention

According to the invention, the circuit scale of the coding apparatus can be reduced without changing the operation speed in coding of a linear code.

BRIEF DESCRIPTION OF THE DRAWINGS

FIG. 3 is a view illustrating another check matrix H wherein the parity part has a form of a lower triangle matrix.

FIG. 4 is a view illustrating an example of a check matrix H used in LDCP coding.

FIG. 6 is a view illustrating a check matrix H' after row permutation or column permutation of the check matrix H of FIG. 4 is performed.

FIG. 11 is a view illustrating sums stored in the RAM of FIG. 8.

FIG. 15 is a view illustrating arithmetic operation of a parity bit p performed by the accumulator of FIG. 14.

FIG. 16 is a view illustrating arithmetic operation of a parity bit p performed by the accumulator of FIG. 14.

FIG. 20 is a view illustrating sums stored in a RAM of FIG. 18.

FIG. 29 is a view illustrating a process where the check matrix H of FIG. 26 is used to perform LDCP coding.

DESCRIPTION OF REFERENCE NUMERALS

1 ... Coding apparatus, 11 ... Bit width adjustment circuit, 12 ... Cyclic shift circuit, 13 ... Adder, 14 ... RAM, 15 ... Interleaver, 16 ... Accumulator, 17 ... Selector, 18 ... Control section, 101 ... Re-arrangement circuit, 102 ... Cyclic shift circuit, 103 ... Adder, 104 ... RAM, 105 ... Control section

BEST MODE FOR CARRYING OUT THE INVENTION

In the following, particular embodiments to which the present invention is applied are described in detail with reference to the drawings.

It is to be noted that, while, in an information word i and a codeword c of an LDPC code, a bit can be represented as $\{0, \ldots, q\}$ ($q \geq 1$) and the information word i and the codeword c need not necessarily be two-dimensional, the following description is given on the assumption that they are two-dimensional.

Figure 4:
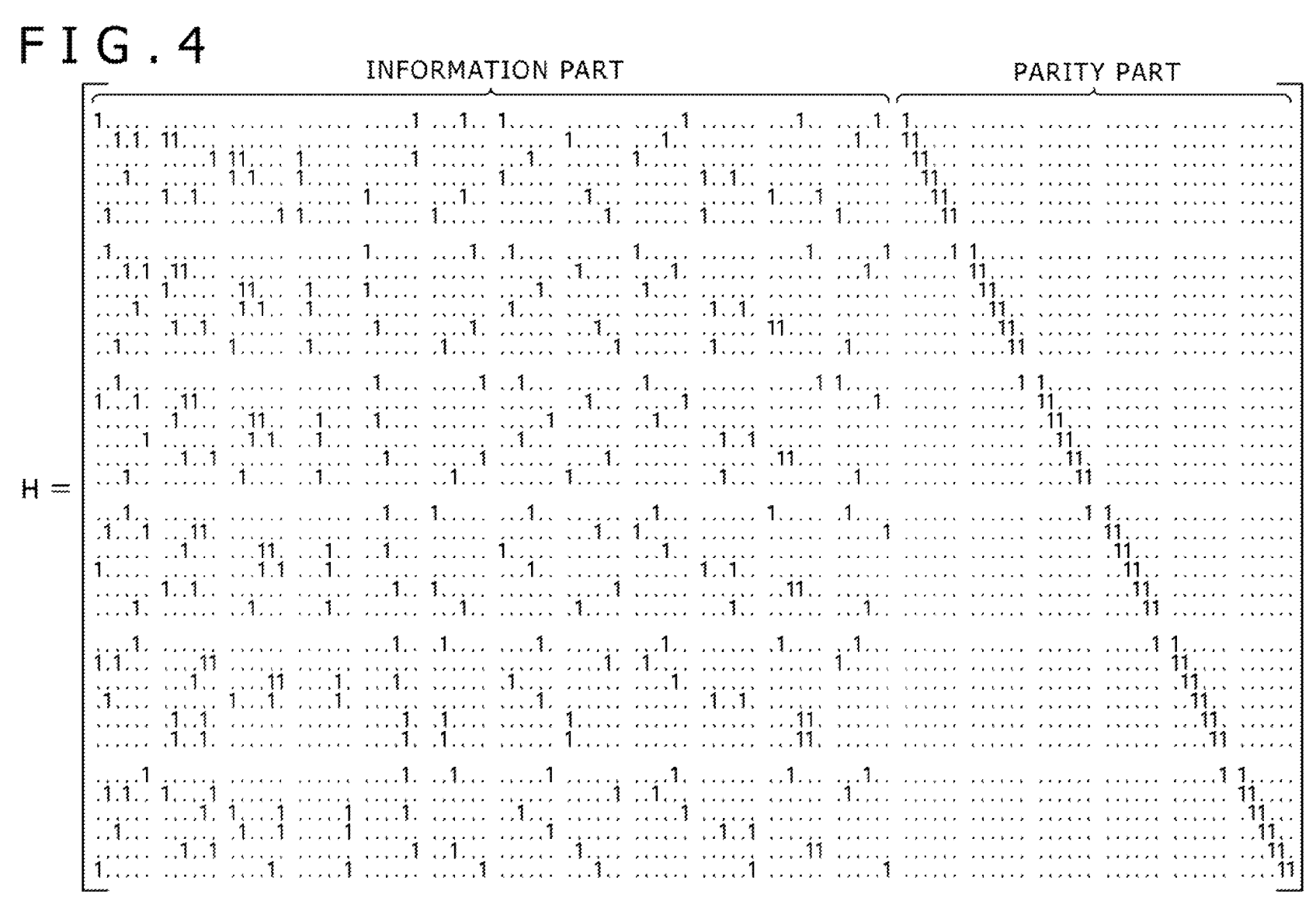

FIG. 4 illustrates an example of a check matrix H used in LDPC coding.

The check matrix H of FIG. 4 is a check matrix H for obtaining a codeword c of n=108, k=72 (coding rate 2/3, code length 108) and is a matrix of 36 (rows)×108 (columns). It is to be noted that, in the check matrix H of FIG. 4 (similar also with regard to matrices of FIGS. 5 to 7, 22 and 25 hereinafter described), 0 is represented by ".". Further, in the check matrix H of FIG. 4, a space is provided between units of a matrix of 6×6.

In particular, the check matrix H is formed from an information part of 36 (=n−k) rows and 72 (=k) columns and a parity part of 36 (=n−k) rows and 36 (=n−k) columns. In coding into an LDPC code, the information part is multiplied by an information word i of a codeword c of an LDPC code, and the parity part is multiplied by a parity bit p of the codeword c.

In the check matrix H of FIG. 4, each row of the information part corresponding to the information word i of an LDPC code includes seven "1s" and 101 "0s". The parity part forms a matrix (lower triangle matrix) having a structure of a lower triangle. In other words, the parity part of the check matrix H of FIG. 4 is a matrix wherein all elements on the right upper side of a diagonal line of the matrix are "0" and has a structure of a lower triangle.

Figure 1:
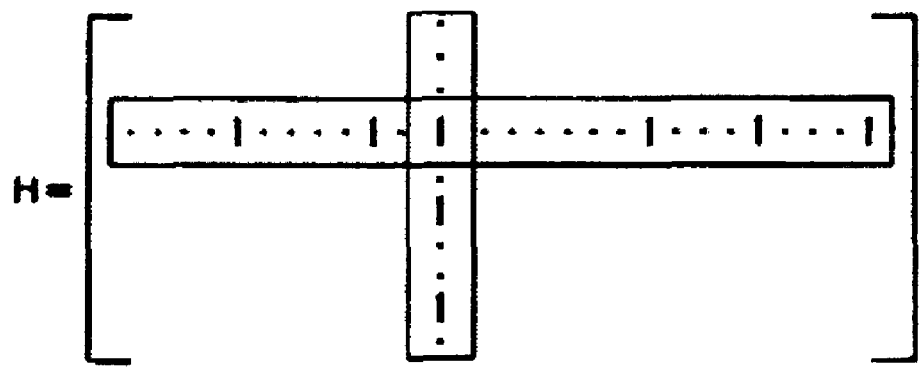
FIG. 1 is a view illustrating a check matrix H of an LDPC code.
Figure 2:
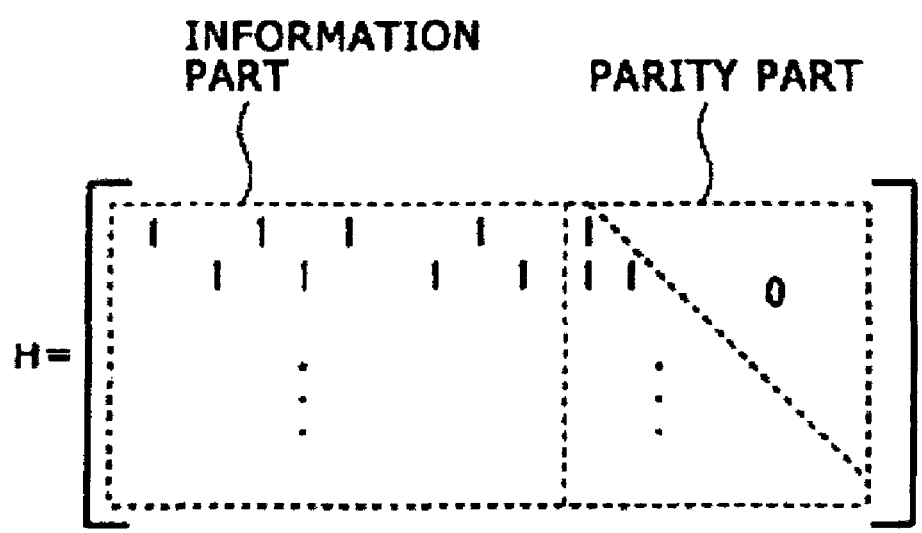
FIG. 2 is a view illustrating a check matrix H wherein the parity part has a form of a lower triangle matrix.
Figure 5:
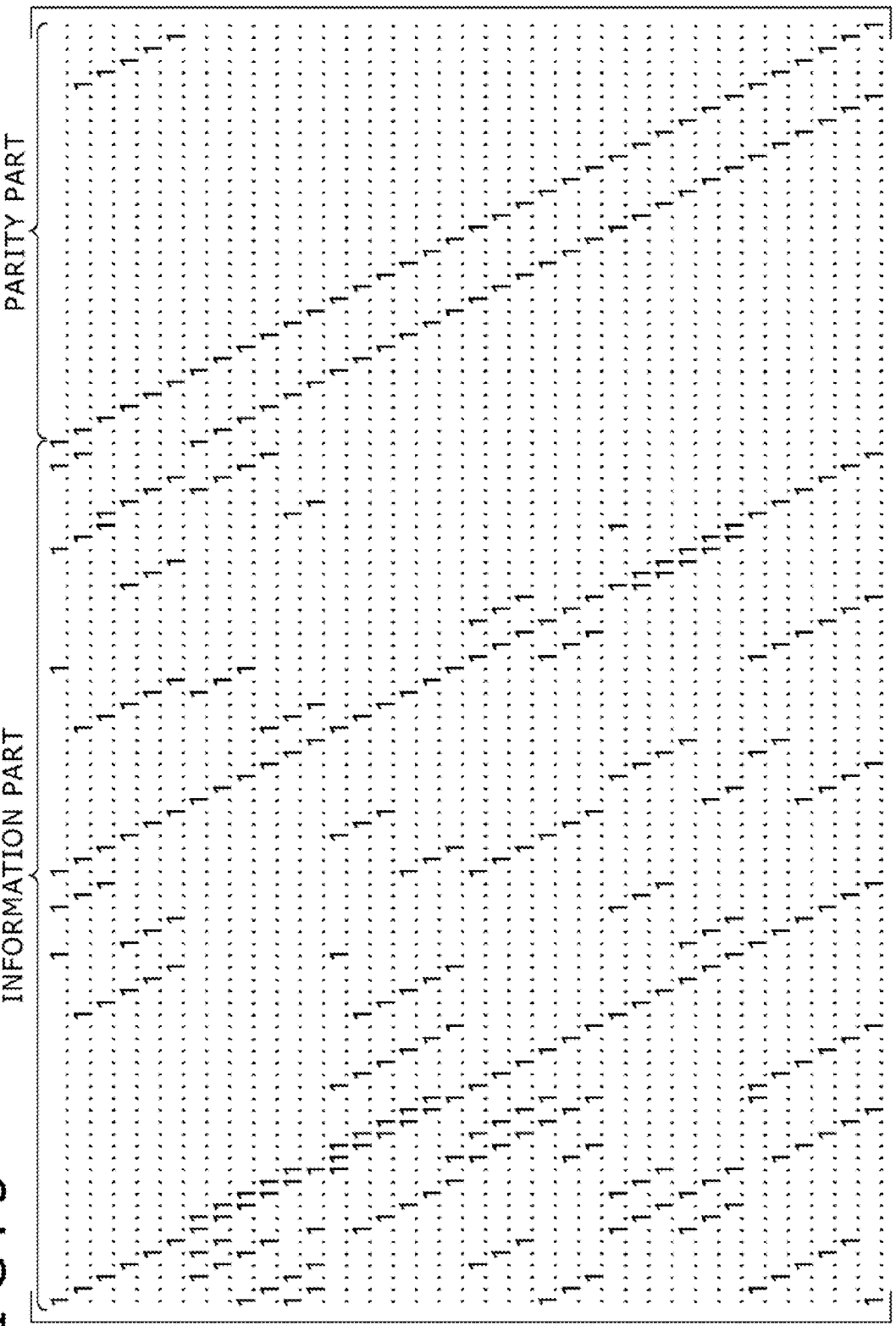
FIG. 5 is a view illustrating a check matrix H' after row permutation or column permutation of the check matrix H of FIG. 4 is performed.
Figure 6:
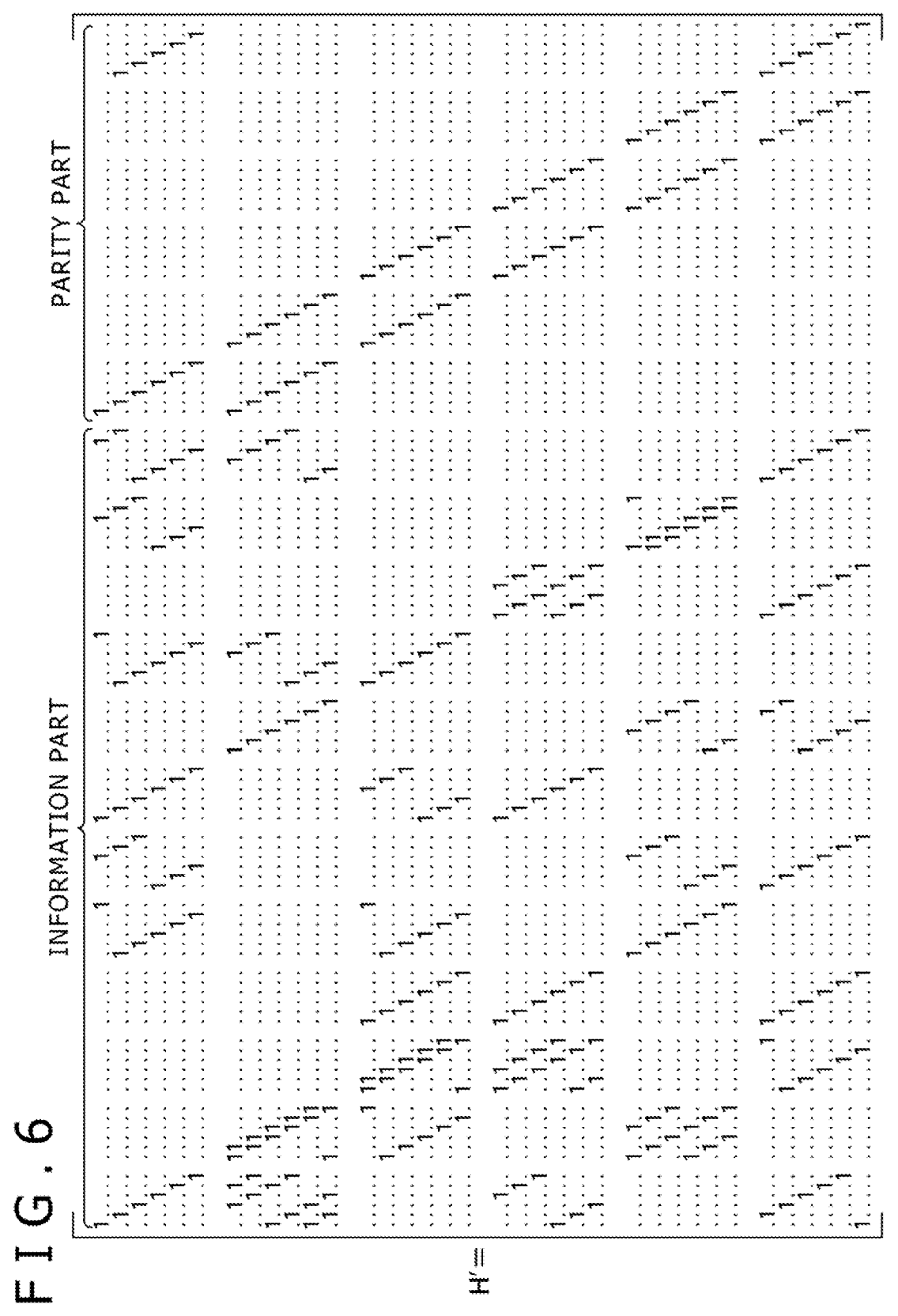
Figure 7:
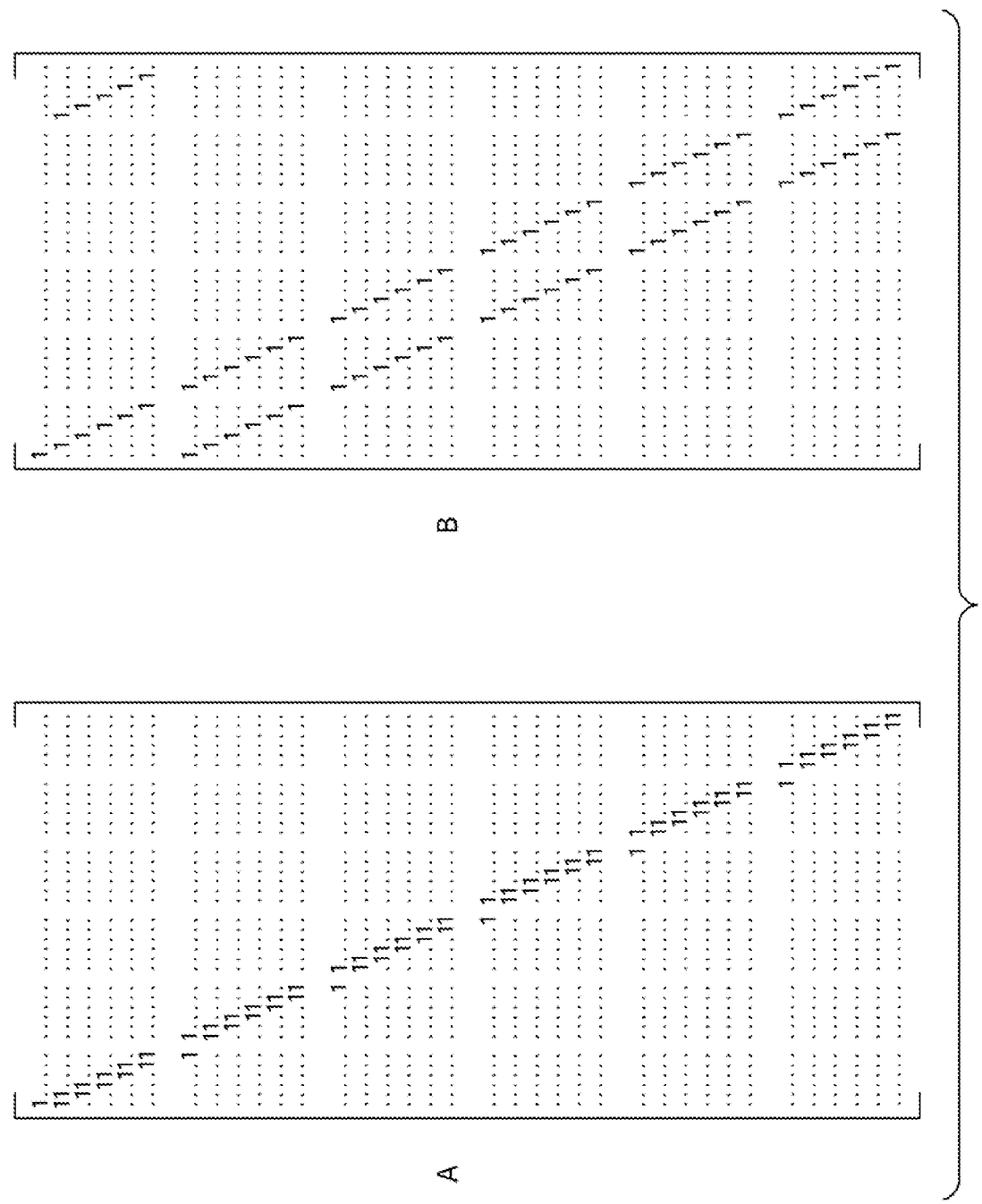
FIG. 7 is a view illustrating the parity parts of the check matrix H of FIG. 4 and the check matrix H' of FIGS. 5 and 6.

FIGS. 5 and 6 show a check matrix H' after row permutation or column permutation of the check matrix H of FIG. 4 is performed.

In the check matrix H' of FIG. 5, the information part can be represented by a combination of a unit matrix of P×P (in the example of FIG. 5, P=6), a matrix (hereinafter referred to suitably as quasi unit matrix) wherein one or more of is in the unit matrix are changed to 0, a matrix (hereinafter referred to suitably as shift matrix) wherein the unit matrix or the quasi unit matrix is cyclically shifted (cyclic shift), the sum (hereinafter referred to suitably as sum matrix) of two or more (a plurality of) ones of the unit matrix, quasi unit matrix and shift matrix, and a 0 matrix of P×P. It is to be noted that, in the following description, the unit matrix, quasi unit matrix, shift matrix, sum matrix or 0 matrix of P×P is hereinafter referred to suitably as component matrix.

In the check matrix H of FIG. 6, the check matrix H illustrated in FIG. 5 is represented such that a space is provided between each adjacent ones of units of a component matrix of 6×6. Where the number of component matrices in the horizontal direction which compose the check matrix H is represented by $n_0$ and the number of component matrices in the horizontal direction which compose the information part of the check matrix H is represented by $k_0$, $n_0$ (=n/P=108/6) is 18 and $k_0$ (=k/P=72/6) is 12.

In particular, in the check matrix H of FIGS. 5 and 6, six (=$n_0-k_0$=18−12) component matrices are arranged in the vertical direction, and $n_0$ (=18) component matrices are arranged in the horizontal direction.

Meanwhile, where the uppermost row (top row) of the check matrix H of FIG. 4 is the zeroth row, the (($n_0-k_0$)×v+w)th (($0 \leq v \leq P-1$, $0 \leq w \leq n_0-k_0-1$)th) row of the check matrix H is the (P×w+v)th row in the check matrix H' of FIGS. 5 and 6.

By performing LDPC coding using the check matrix H' of FIG. 5 or 6, arithmetic operation of each row of the information part of the check matrix H' and the information word i which is arithmetic operation necessary for LDPC coding can be performed by cyclically shifting the information word i in a unit of six components. In particular, since the number of "1s" in each row of a unit matrix, a quasi unit matrix or a shift matrix of P×P when a unit matrix, a quasi matrix or a shift matrix of P×P which is a component matrix or a sum matrix of component matrices is decomposed into a plurality of matrices is 1, by cyclically shifting six information words i corresponding to the component matrices, the products of the rows of the information part of the check matrix H' and the information words i can be calculated.

FIGS. 7A to 7B illustrate the parity parts of the check matrix H of FIG. 4 and the check matrix H' of FIGS. 5 and 6.

As seen in FIG. 7A, the parity part of the check matrix H of FIG. 4 has a form of a matrix wherein all of those components positioned on the right upper side of an orthogonal line have the value "0" and has a structure of a lower triangle. Further, in the parity part, the diagonal elements of the lower triangle matrix and those elements which are positioned just below the diagonal elements have the value 1 while any other element has the value 0. Consequently, arithmetic operation of determining a parity bit p upon LDPC coding can be performed readily.

As seen in FIG. 7B, in the parity part of the check matrix H' of FIGS. 5 and 6, the (P×w+v)th row is the (($n_0-k_0$)×v+w)th row of the parity part of FIG. 7A.

Figure 8:
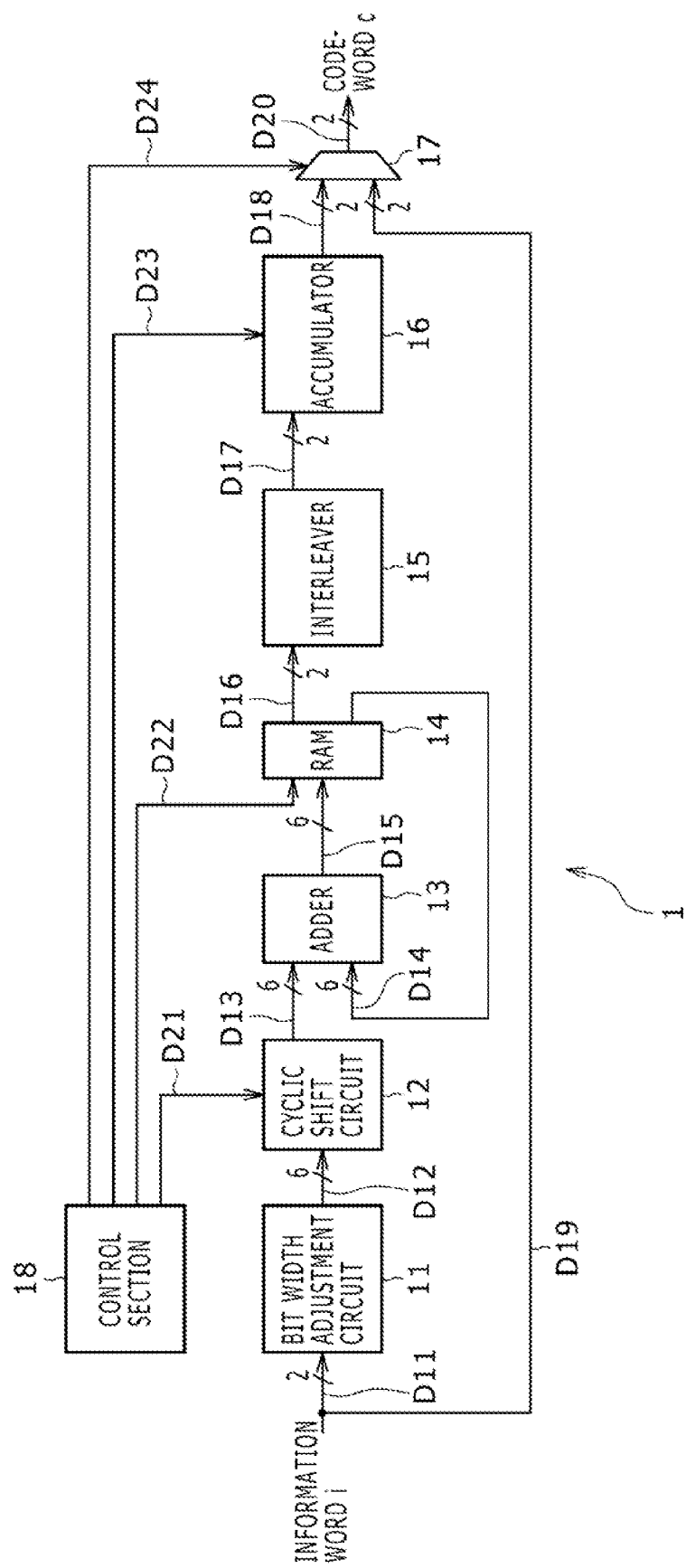
FIG. 8 is a block diagram showing an example of a configuration of a first embodiment of a coding apparatus to which the present invention is applied.

FIG. 8 is a block diagram showing an example of a configuration of a first embodiment of a coding apparatus 1 to which the present invention is applied.

The coding apparatus 1 of FIG. 8 uses the check matrix H of FIG. 4 to LDPC code an information word i and outputs a codeword c obtained as a result of the LDPC coding.

The coding apparatus 1 is composed of a bit width adjustment circuit 11, a cyclic shift circuit 12, an adder 13, a RAM 14, an interleaver 15, an accumulator 16, a selector 17 and a control section 18.

An information word D11 (information word i) is supplied in a unit of two bits to the bit width adjustment circuit 11. The bit width adjustment circuit 11 combines three information words D11 supplied thereto in a unit of two bits to produce an information word D12 in a unit of six bits and supplies the information word D12 to the cyclic shift circuit 12.

To the cyclic shift circuit 12, a control signal D21 which represents information of by what number of component distances a unit matrix or the like on which the check matrix H' is based is cyclically shifted to obtain 1 of the information part of the check matrix H' corresponding to the information word D12 is supplied from the control section 18. The cyclic shift circuit 12 cyclically shifts 12 (=$k_0$) information words D12 of six bits successively supplied thereto from the bit width adjustment circuit 11 based on the control signal D21 to determine the products (h×i) of the value h of the rows of those of the component matrices of the check matrix H' which are not 0 matrices and the information words D12. Then, the cyclic shift circuit 12 successively supplies (outputs) the products (h×i) to the adder 13.

It is to be noted that, where a component matrix is a sum matrix, that is, where the Hamming weight of the component matrix is equal to or greater than 2, the cyclic shift circuit 12 determines the products of matrices, which includes a plurality of ones of a unit matrix, a quasi unit matrix or a shift matrix into which the sum matrix is decomposed, and the information words D12 in a unit of a matrix, and supplies values obtained by EXOR arithmetic operation (addition) of the products for the individually corresponding rows as information words D13 to the adder 13. Further, while the cyclic shift circuit 12 performs cyclic shifting of an information word D12 in a unit of six bits, it may otherwise perform cyclic sifting of an information word D12 in a bit unit of a number of an aliquot part of 6 (=P).

The adder 13 is formed from six adders (not shown), each of which determines EXOR of a product D13 of six bits from the cyclic shift circuit 12 and a sum D14 of six bits from the RAM 14 for each bit and supplies values of 6 bits obtained by the determination as a sum D15 (first integration value) to the RAM 14 thereby to arithmetically operate the products D13 for the individual rows in a unit of six rows.

To the RAM 14, a control signal D22 which designates an address from or into which data is to be read out or written is supplied from the control section 18. The RAM 14 stores the sums D15 from the adder 13 in a unit of six bits or reads out the sums D15 stored already therein in a unit of six bits or two bits based on the control signal D22.

Since the RAM 14 can store or read out a sum D15 of six bits or two bits at the same time in this manner, a process for LDPC coding can be performed in a unit of six bits or two bits. As a result, the coding apparatus 1 can perform LDPC coding with a suitable circuit scale and in a suitable operation frequency.

The RAM 14 supplies a sum D15 read out in a unit of six bits as sums D14 to the adder 13 or supplies a sum D15 read out in a unit of two bits as a sum D16 to the interleaver 15. It is to be noted that the number of bits of the RAM 14 is 6 (=P), and the word number is six (=$n_0 - k_0$).

The interleaver 15 controls the sequence of the sums d16 successively supplied thereto from the RAM 14. In particular, the interleaver 15 re-arranges the sums D16 into an order corresponding to the check matrix H and supplies sums D17 after the re-arrangement to the accumulator 16.

To the accumulator 16, a selection signal D23 which represents selection of a selector 62 (hereinafter described with reference to FIG. 14) of the accumulator 16 is supplied from the control section 18. The accumulator 16 performs predetermined arithmetic operation (for example, the expressions (2), (4) and (6)) based on the selection signal D23 and the sums D17 successively supplied thereto from the interleaver 15, and successively supplies (outputs) a parity bit p obtained by the arithmetic operation in a unit of two bits as a parity bit D18 to the selector 17. In other words, the accumulator 16 integrates the sums D17 and supplies a parity bit p obtained as a result of the integration in a unit of two bits as a parity bit D18 (second integration value) to the selector 17.

The information word i delayed by a predetermined interval of time is supplied in a unit of two bits as an information word D19 to the selector 17. The selector 17 selects one of the parity bit D18 from the accumulator 16 and the information word D19 based on a selection signal D24 representative of selection of one of the parity bit D18 and the information word D19, and outputs a result of the selection in a unit of two bits as a codeword D20 (codeword c). More particularly, the selector 17 outputs the information word D19 of k bits in a unit of two bits and then outputs the parity bit D18 of n−k bits in a unit of two bits thereby to output a codeword D20.

The control section 18 supplies a control signal D21 to the cyclic shift circuit 12, supplies another control signal D22 to the RAM 14, a selection signal D23 to the accumulator 16 and supplies another selection signal D24 to the selector 17.

The amount of cyclic shifting performed by the cyclic shift circuit 12 of FIG. 8 is described with reference to FIG. 9.

It is to be noted that, in the following description, an information word D12 of (6×s)th to (6×(s+1)−1)th bits (s=0, 1, 2, . . . , $k_0$−1) of the information word i supplied from the bit width adjustment circuit 11 is hereinafter referred to as sth vector.

Figures 9, 10:
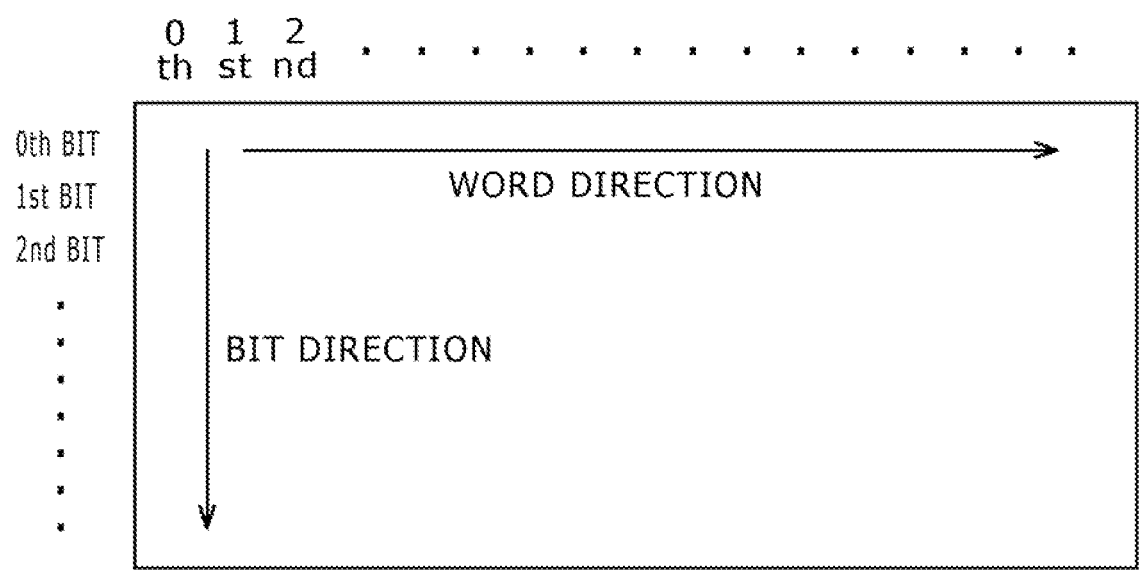
FIG. 9 is a view illustrating the amount of cyclic shifting performed by a cyclic shift circuit of FIG. 8.
FIG. 10 is a view illustrating sums stored in a RAM of FIG. 8.

Referring to FIG. 9, each numerical value on the uppermost row represents the number of a vector, and each numerical value at the left end represents the number of a component matrix of the check matrix H' from above. It is to be noted that the numbers from above of the component matrices are applied in order from 0. Further, in FIG. 9, "-" represents that the cyclic shift circuit 12 does not output an information word D13.

For example, if the mth row of the lth column is represented by (m, l), then in the check matrix H', the component matrices from (0, 0) to (5, 5) are unit matrices; the component matrices from (6, 0) to (11, 5) are sum matrices (sum matrices which are the sums of first shift matrices obtained by cyclically shifting the unit matrices of 6×6 by two element distances in the rightward direction and second shift matrices obtained by cyclically shifting the unit matrix of 6×6 by four element distances in the rightward direction); the component matrices from (12, 0) to (17, 5) are 0 matrices; the component matrices from (18, 0) to (23, 5) are shift matrices (shift matrices obtained by cyclically shifting the unit matrices of 6×6 by three element distances in the rightward direction; the component matrices from (24, 0) to (29, 5) are 0 matrices; and the component matrices from (30, 0) to (35, 5) are shift matrices (shift matrices obtained by cyclically shifting the unit matrices of 6×6 by five element distances in the rightward direction.

Thus, the cyclic shift circuit 12 first does not perform cyclic shifting in response to the component matrices of the zeroth to fifth columns from the left of the check matrix H', and outputs, as the products of the zeroth vector and the component matrices of (0, 0) to (5, 5) of the check matrix H', the zeroth vector as it is as the products D13. In particular, as seen in FIG. 9, where the product of the zeroth vector and the zeroth component matrix from above of the check matrix H' is to be determined, the cyclic shift amount of the cyclic shift circuit 12 is 0.

Then, the cyclic shift circuit 12 cyclically shifts the zeroth vector by two element distances in the rightward direction and cyclically shifts the zeroth vector by four element distances in the rightward direction. Then, the cyclic shift circuit 12 performs EXOR arithmetic operation of the two information words D12 of six bits obtained by the cyclic shifting to determine the products of the zeroth vector and the component matrices from (6, 0) to (11, 5). In particular, the cyclic shift circuit 12 performs EXOR arithmetic operation of the information words D12 obtained, when the component matrices from (6, 0) to (11, 5) are each decomposed into the sum of a first shift matrix and a second shift matrix, from the first and second shift matrices so that the information words D12 obtained for the first and second shift matrices are stored into the same address of the RAM 14 through the adder 13. Then, the cyclic shift circuit 12 outputs the determined products as products D13.

In particular, as seen in FIG. 9, where the product of the zeroth vector and the first component matrices from above of the check matrix H' is to be determined, the cyclic shift amount of the cyclic shift circuit 12 is two and four in the rightward direction.

Here, since the component matrices from (12, 0) to (17, 5) on the second row from above of the check matrix H' are 0 matrices, the cyclic shift circuit 12 does not perform any process for the component matrices and outputs nothing ("-" in FIG. 9).

Thereafter, the cyclic shift circuit 12 cyclically shifts the zeroth vector three times in the rightward direction in a similar manner to determine the products of the zeroth vector and the component matrices of (18, 0) to (23, 5) of the third row of the check matrix H'. Further, the cyclic shift circuit 12 cyclically shifts the zeroth vector five times in the leftward direction to determine the products of the zeroth vector and the component matrices of (30, 0) to (35, 5). Then, the cyclic shift circuit 12 outputs the information words D12 after such cyclic shifting as products D13.

The cyclic shift circuit 12 determines the products of the zeroth vector supplied for the first time from the bit width adjustment circuit 11 and the zeroth to fifth ((=P−1)th) columns from the left of the check matrix H' in such a manner as described above.

Thereafter, the cyclic shift circuit 12 determines the products of the first to eleventh vectors supplied from the bit width adjustment circuit 11 for the second to twelfth times and the sixth to seventy-first columns from the left of the check matrix H' similarly.

Now, the sums D15 stored in the RAM 14 of FIG. 8 are described with reference to FIGS. 10 and 11.

It is to be noted that the word direction of the RAM 14 used in the following description is a horizontal direction as seen in FIG. 10, and the addresses are referred to as zeroth address, first address, second address, . . . in order from the left end. Further, the bit direction of the RAM 14 is a vertical direction in FIG. 10, and the addresses are referred to as zeroth bit, first bit, second bit, . . . in order from above.

Further, in the following description, the sum D15 of the products of the values of the wth row ((=P×v+w=6×v+w)th) row) from above of the vth component matrices from above of the check matrix H' and the zeroth to 11th vectors is represented also as $o_{w,v}$. In other words, $o_{w,v}$ is represented by the following expression (7).

[Expression 7]

$$o_{v,w} = \sum_{j=0}^{k-1} h_{6 \times v + w, j} i_j \ (\text{mod}) \quad (7)$$

As seen in FIG. 11, the bit number of the RAM 14 is P (=6), and the word number is $n_0 - k_0$ (=6). First, the products of the zeroth vector and the zeroth component matrices from above of the check matrix H' are supplied as the sums D15 of six bits from the cyclic shift circuit 12 to the RAM 14. The RAM 14 stores the bits of the sums D15 in order beginning with the zeroth bit of the zeroth address.

Then, the products of the first vector and the first component matrices from above of the check matrix H' are supplied as sums D15 of six bits from the cyclic shift circuit 12 to the RAM 14 through the adder 13. The RAM 14 supplies the bits of the sums D15 in order beginning with the zeroth bit of the first address. Thereafter, the sums D15 are stored also into the second to fifth addresses of the RAM 14.

Further, the RAM 14 reads out the products of the zeroth vector stored in the zeroth to fifth bits of the zeroth address and the zeroth component matrices from above of the check matrix H' and supplies the products as the sums D14 of six bits to the adder 13. Thereafter, the RAM 14 reads out the sums D15 of six bits stored in the first to fifth addresses of the RAM 14 and supplies the sums D15 as sums D14 to the adder 13 similarly.

The adder 13 performs EXOR arithmetic operation of the products of the zeroth vector and the zeroth component matrices from above of the check matrix H' supplied as the sums D14 of six bits from the RAM 14 and the products of the first vector and the zeroth component matrices from above of the check matrix H' supplied from the cyclic shift circuit 12. Then, the adder 13 supplies sums D15 obtained as a result of the EXOR arithmetic operation to the RAM 14. The RAM 14 stores the bits of the sums D15 in order beginning with the zeroth bit of the zeroth address. In other words, the RAM 14 updates the zeroth address. Thereafter, the RAM 14 updates also the first to fifth addresses in a similar manner.

Then, a similar process is repeated, and stores $o_{0,0}$ which is the sum D15 of the products of the zeroth row from above of the zeroth component matrices from above of the check matrix H' and the zeroth to 11th vectors into the zeroth bit of the zeroth address of the RAM 14. Further, $o_{1,0}$ to $o_{5,0}$ are stored into the first to fifth bits of the zeroth address of the RAM 14, respectively.

Similarly, $o_{0,1}$ to $o_{5,1}$ are stored into the zeroth to fifth bits of the first address of the RAM 14, respectively; $o_{0,2}$ to $o_{5,2}$ are stored into the zeroth to fifth bits of the second address, respectively; $o_{0,3}$ to are stored into the zeroth to fifth bits of the third address of the RAM 14, respectively; $o_{0,4}$ to $o_{5,4}$ are stored into the zeroth to 5th bits of the fourth address of the RAM 14, respectively; and $o_{0,5}$ to $o_{5,5}$ are stored into the zeroth to 5th bits of the 5th address of the RAM 14, respectively.

As described above, an address of the RAM 14 corresponds to six rows of the information part of the check matrix H, and the RAM 14 stores the sums D15 ($o_{0,0}$ to $o_{5,5}$) such that the row number (6×v+w) from above of the check matrix H' corresponding to a sum D15 increases in a direction from the left upper corner toward the right lower corner in FIG. 11. Further, the RAM 14 stores $o_{0,0}$ to $o_{5,5}$ such that 1s of the component matrices of the check matrix H' are filled in a column direction (horizontal direction).

Here, the sum D15 whose order number in the bit direction (vertical direction) is P×x+y (x=0, 1, . . . , 5, y=0, 1, . . . , 5) has the order number of $(n_0-k_0) \times y+x$ in the word direction (horizontal direction). It is to be noted that the order in the bit direction is such that the fifth bit of each number address is followed by the zeroth bit of the next right side address (address of the next number). Further, the order in the word direction is such that the fifth address of each bit is followed by the zeroth address of the immediately underlying bit (next bit). For example, the sum D15 whose order number in the bit direction is six is $o_{0,1}$ and the sum D15 whose order number in the word direction is 6 is $o_{1,0}$.

As described above, the $((n_0-k_0) \times v+s)$th row of the check matrix H becomes the (P×w+v)th row of the check matrix H' of FIG. 5. In other words, the (P×w+v)th row of the check matrix H' is the $((n_0-k_0) \times v+s)$th row of the check matrix H. Accordingly, the sums D15 are stored in order from the zeroth row of the check matrix H' in the bit direction of the RAM 14. The sums of the products of the rows of the information part of the check matrix H' and the zeroth to 11th vectors, $o_{w,v}$ is, as viewed in order in the word direction, $o_{w,v}$ which is the sums of the products corresponding in order from the zeroth row of the check matrix H.

However, since the RAM 14 generally cannot access two or more addresses at a time, it cannot read out the sums D15 in the word direction. Accordingly, in the coding apparatus 1, the order of the sums D15 read out in the bit direction by the RAM 14 are changed by the interleaver 15. Details of the interleaver 15 are described below with reference to FIGS. 12 and 13.

Figure 12:
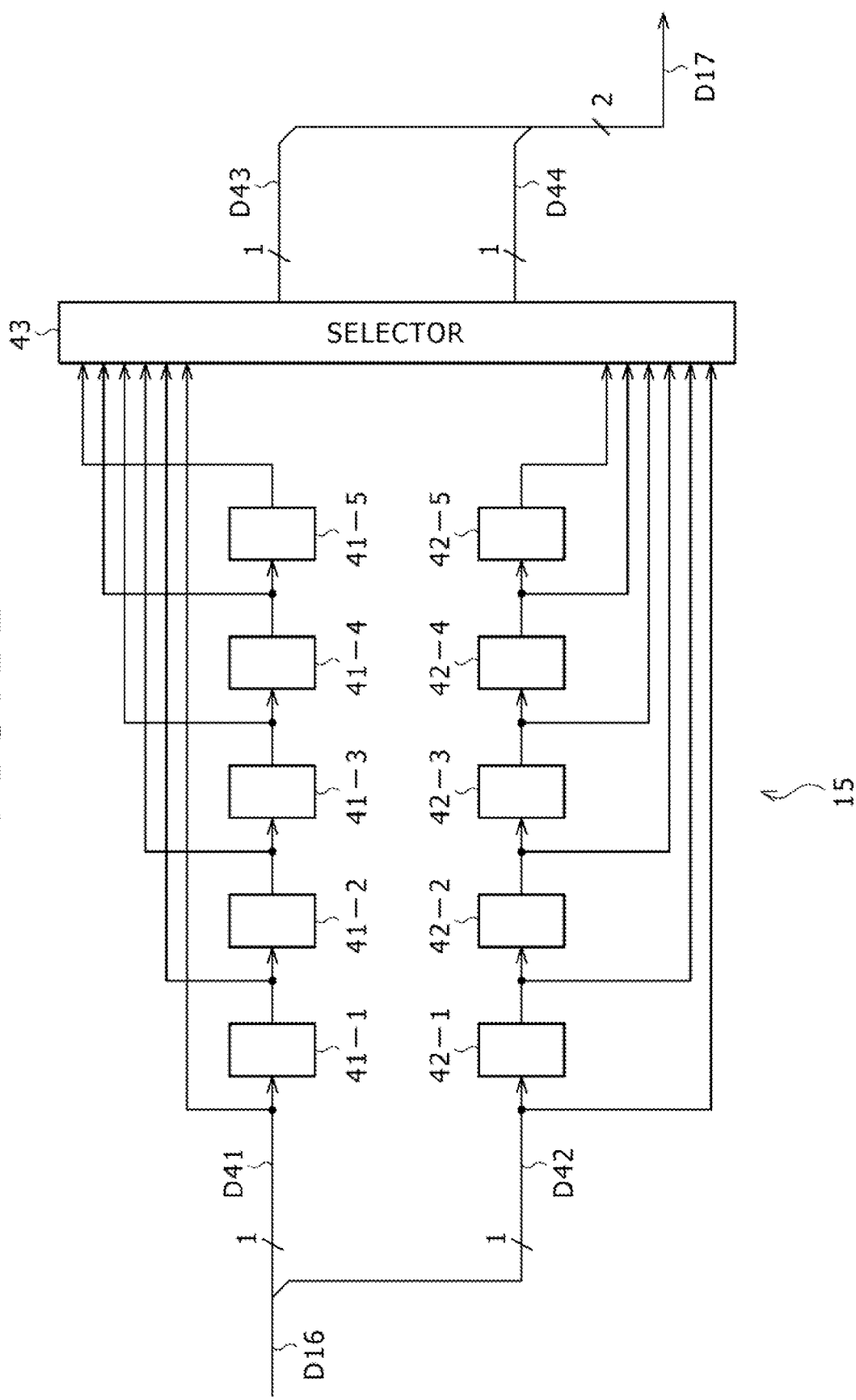
FIG. 12 is a view illustrating the amount of cyclic shifting performed by the cyclic shift circuit of FIG. 8.

FIG. 12 is a view showing an example of a detailed configuration of the interleaver 15 of FIG. 8.

The interleaver 15 of FIG. 12 is supplied with five registers 41-1 to 41-5, five registers 42-1 to 42-5 and a selector 43.

Sums D16 of two bits are successively supplied from the RAM 14 to the interleaver 15, and one of the two bits is successively stored as a sum D41 in a unit of one bit into the registers 41-1 to 41-5. Further, the other one bit is successively stored as a sum D42 in a unit of one bit into the registers 41-2 to 41-5. The registers 41-1 to 41-5 and the registers 42-1 to 42-5 successively supply a sum D41 or D42 of a bit stored therein to the selector 43.

The selector 43 selects two sums D41 or D42 from among the five sums D41 or D42 successively supplied thereto from the registers 41-1 to 41-5 and the registers 42-1 to 42-5 and outputs the selected two sums D41 or D42 as sums D43 and D44. The sums D43 and D44 of 1 bit are combined and supplied as a sum D17 of two bits to the accumulator 16.

In this manner, in the interleaver 15, the registers 41-1 to 41-5 and the registers 42-1 to 42-5 store the sums D16 (sums D41 or D42) inputted thereto, and the selector 43 selects the sums D16 stored in the registers 41-1 to 41-5 and the registers 42-1 to 42-5 and outputs the selected sums D16 as a sum D17 (sums D43 or D44) thereby to change the order of the sums D16 inputted thereto to that of the sums D17 to be outputted.

Figure 13:
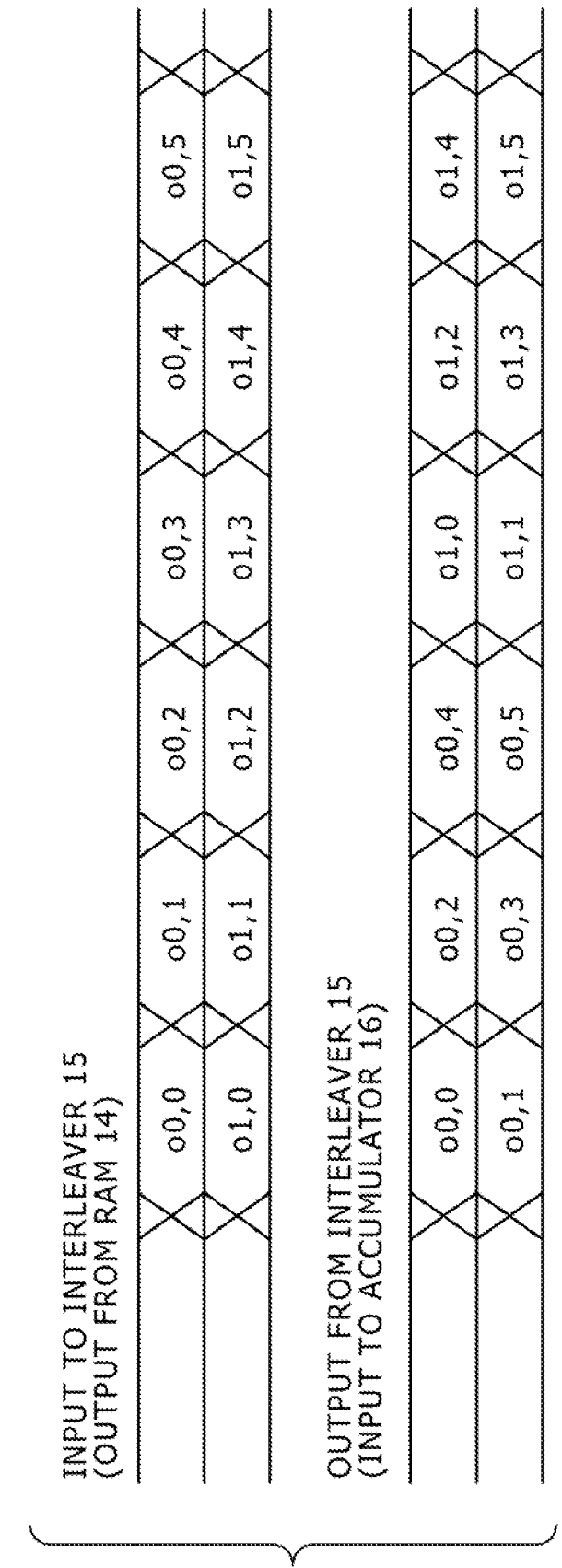
FIG. 13 is a timing chart illustrating inputting and outputting of data to and from an interleaver of FIG. 12.

Now, inputting and outputting of data to and from the interleaver 15 of FIG. 12 is described with reference to a timing chart of FIG. 13. In FIG. 13, the axis of abscissa indicates time.

As seen in FIG. 13, the RAM 14 first reads out two bits of $o_{0,0}$ and $o_{1,0}$ stored in the zeroth address as a sum D16 and outputs the sum D16 to the interleaver 15. In other words, $o_{0,0}$ and $o_{1,0}$ are inputted as the sum D16 to the interleaver 15.

Then, the RAM 14 outputs two bits of $o_{0,1}$ and $o_{1,1}$ stored in the first address as a sum D16 to the interleaver 15. Thereafter, the RAM 14 outputs $o_{0,2}$ and $o_{1,2}$, $o_{0,3}$ and $o_{1,3}$, $o_{0,4}$ and $o_{1,4}$ or $o_{0,5}$ and $o_{1,5}$ stored in the second to fifth addresses as a sum D16 to the interleaver 15, respectively.

To and into the registers 41-1 to 41-5 of the interleaver 15 of FIG. 12, for example, $o_{0,0}$ to $o_{0,5}$ which are one bit of the sums D16 inputted to the interleaver 15 are successively supplied and stored. Further, $o_{1,0}$ and $o_{5,0}$ which are the other one bit are successively supplied to and stored into the registers 42-1 to 42-5. Then, the registers 41-1 to 41-5 and the registers 42-1 to 42-5 supply $o_{0,0}$, to $o_{0,5}$ and $o_{1,0}$ and $o_{0,0}$ to the selector 43, respectively.

As seen in FIG. 13, the selector 43 first selects $o_{0,0}$ and $o_{0,1}$ and outputs them as sums D43 and D44, respectively. In other words, $o_{0,0}$ and $o_{0,1}$ are inputted as a sum D17 to the accumulator 16. Then, the selector 43 selects $o_{0,2}$ and $o_{0,3}$ and outputs them as sums D43 and D44, respectively. Thereafter, the selector 43 successively selects and outputs $o_{0,4}$ and $o_{0,5}$, $o_{1,0}$ and $o_{1,1}$, $o_{1,2}$ and $o_{1,3}$ and $o_{1,4}$ and $o_{1,5}$ in this order.

In particular, where $o_{0,0}$ to $o_{0,5}$ stored in the zeroth bit of the RAM 14 which is one bit of a sum D16 inputted to the interleaver 15 are denoted by series #1 and $o_{1,0}$ to $o_{5,1}$ stored in the first bit of the RAM 14 which is the other one bit are denoted by series #2, the selector 43 successively selects two bits in order from within the series #1 beginning with $o_{0,0}$ and then successively selects two bits in order from within the series #2 beginning with $o_{1,0}$. In other words, the selector 43 successively selects the sums D16 inputted thereto by two bits in the word direction of the RAM 14 in which the sums D16 are stored.

In this manner, the interleaver 15 selects the sums D16 of two bits read out in order in the bit direction of the RAM 14 and inputted thereto successively by two bits in order in the word direction of the RAM 14 in which the sums D16 are stored and outputs the selected sums D16. Therefore, the interleaver 15 can output $o_{w,v}$ which is the sums of the products of the rows of the information part of the check matrix H and the zeroth to 11th vectors in order beginning with the zeroth row of the information part of the check matrix H in a unit of two bits as sums D17.

Figure 14:
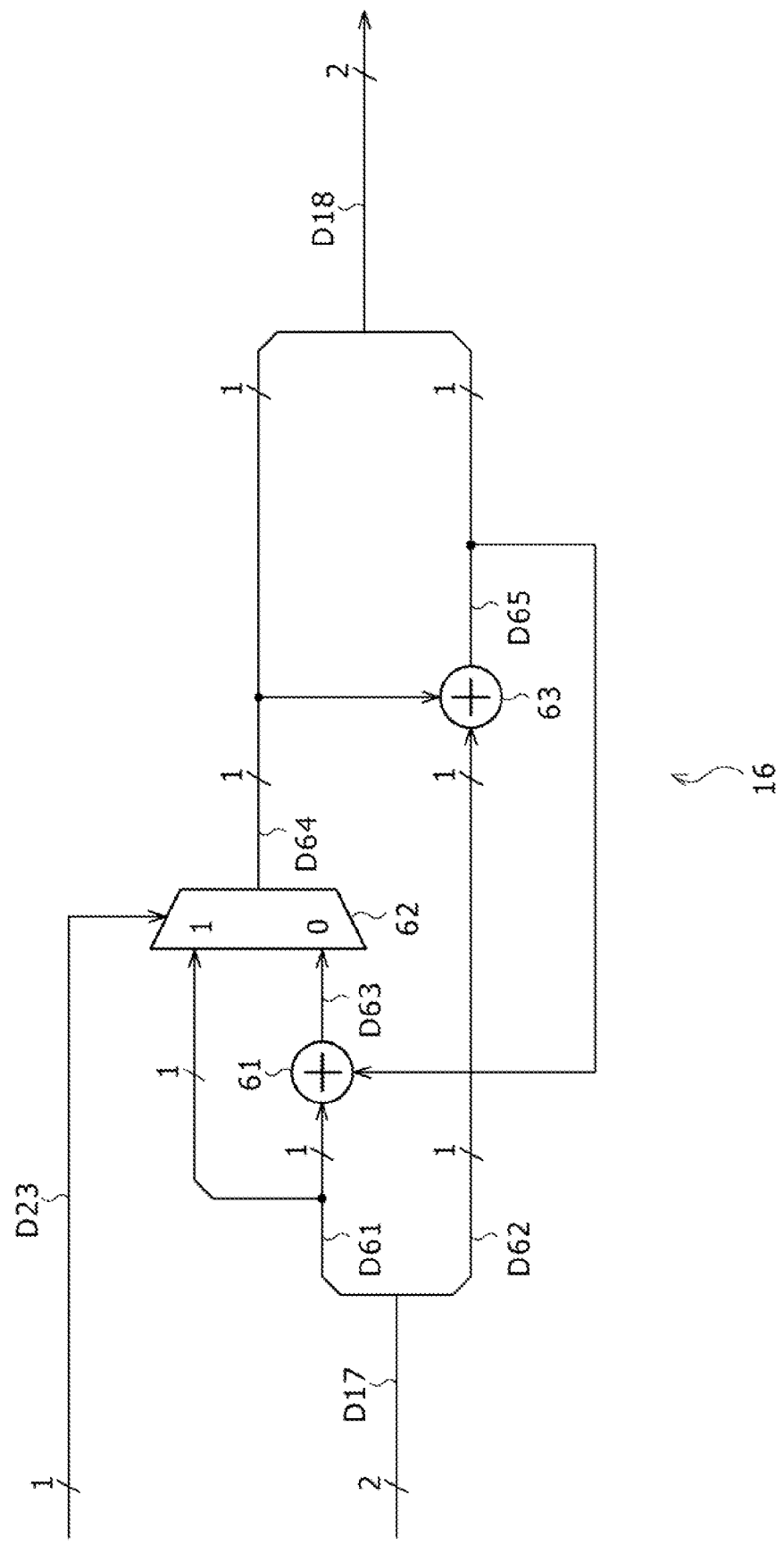
FIG. 14 is a view illustrating an example of a detailed configuration of an accumulator of FIG. 8.

FIG. 14 shows an example of a detailed configuration of the accumulator 16 of FIG. 8.

The accumulator 16 of FIG. 14 is composed of adders 61 and 63 and a selector 62.

To the adder 61, a sum D61 which is one bit from within a sum D17 of two bits is supplied from the interleaver 15, and a parity bit D65 obtained as a result of preceding addition is supplied from the adder 63. The adder 61 adds the sum D61 and the parity bit D65 and supplies a resulting value as a sum D63 to the selector 62.

To the selector 62, the sum D61 is supplied, and also a selection signal D23 is supplied from the control section 18. The selector 62 outputs the sum D61 or D63 as a parity bit D64 to the selector 17 and the adder 63 based on the selection signal D23.

To the adder D63, a sum D62 which is one bit other than the sum D61 from within the sum D17 of two bits from the interleaver 15 is supplied. The adder D63 adds the parity bit D64 obtained as a result of preceding addition supplied from the selector 62 and the sum D62 and outputs a resulting value as a parity bit D65 to the selector 17 and the adder 61. It is to be noted that the sums D64 and D65 outputted from the selector 62 and the adder 63 are combined and supplied as a parity bit D18 (parity bit p) of two bits to the selector 17.

Arithmetic operation of a parity bit p performed by the accumulator 16 of FIG. 14 is described with reference to FIGS. 15 and 16.

Figure 16:
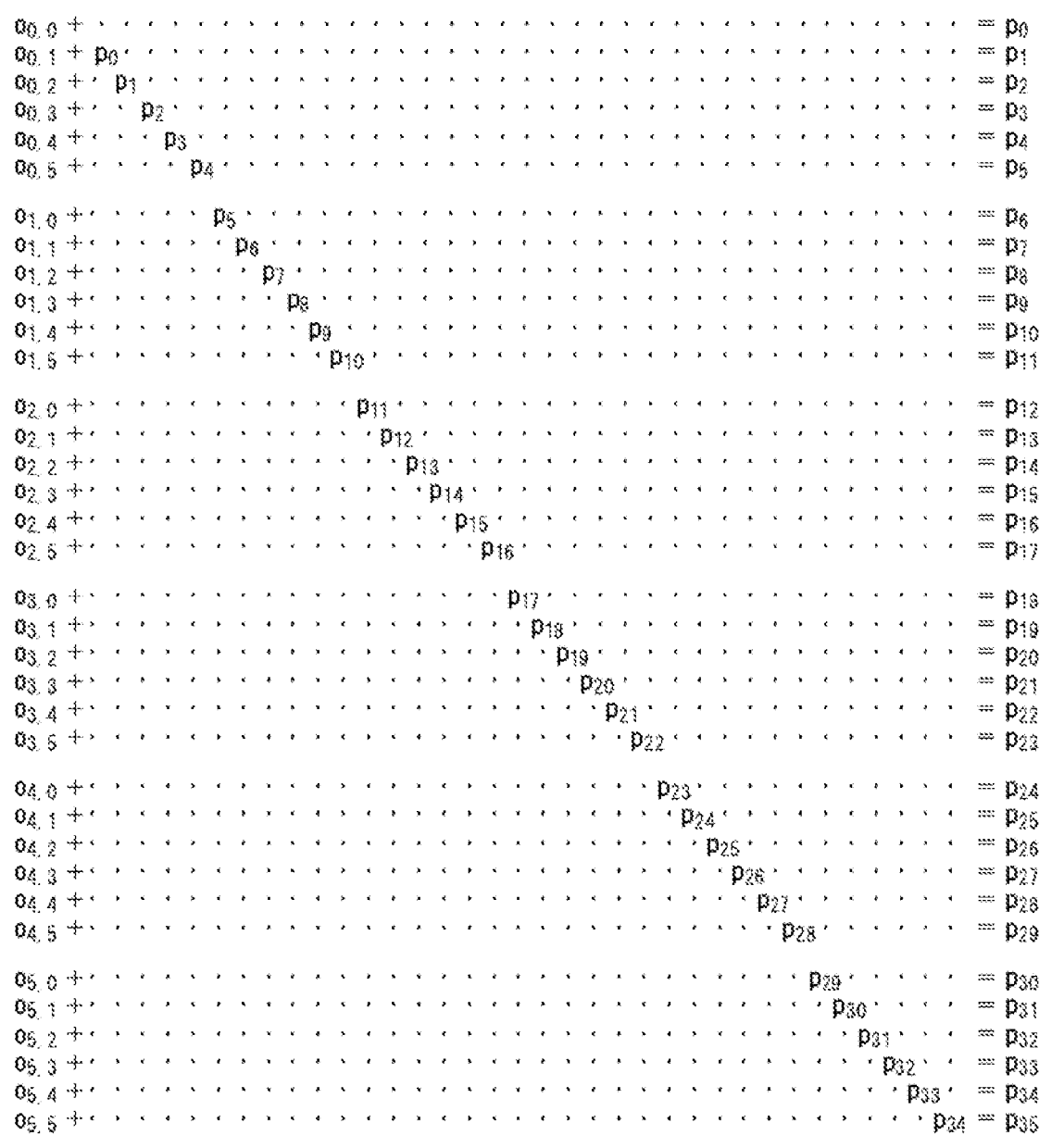

As seen in FIGS. 15 and 16, the parity bit $P_0$ is $P_0 = o_{0,0}$ from the expression (2) and the expression (7) given hereinabove. Further, as seen in FIG. 15, $o_{0,1} + h_{l,k} P_0 + p_1 = 0$ from the expression (3) and the expression (7) given hereinabove, and $h_{l,k}$ is 1 in the check matrix H. Therefore, $o_{0,1} + p_0 + p_1 = 0$ ($o_{0,1} = p_0 + p_1$). In other words, as seen in FIG. 16, the parity bit $p_1$ is $p_1 = o_{0,0} + p_0$.

More particularly, a sum D17 of two bits of $o_{0,0}$ and $o_{0,1}$ from the interleaver 15 is supplied to the accumulator 16, and $o_{0,0}$ is supplied as a sum D61 to the adder 61 and the selector 62 while $o_{0,1}$ is supplied as a sum D62 to the adder 63. At this time, since addition by the adder 63 has not been performed as yet, no parity bit D65 is supplied to the adder 61. Consequently, the adder 63 supplies the sum D61 as it is as a sum D63 to the selector 62.

The selector 62 selects the sum D61 (in the present case, $o_{0,0}$) from the interleaver 15 based on the selection signal D23 and outputs the sum D61 as a parity bit D64 (in the present case, $p_0$) to the selector 17 and the adder 63. The adder 63 adds the sum D62 (in the present case, $o_{0,1}$) from the interleaver 15 and the parity bit D64 from the selector 62 and outputs a resulting value (in the present case, $o_{0,1} + p_0$) as a parity bit D65 (in the present case, $p_1$) to the selector 17 and the adder 61. As a result, the sums D64 and D65 are combined and outputted as a parity bit D18 of two bits to the selector 17 and the adder 61.

Therefore, the accumulator 16 arithmetically operates the parity bits $p_2$ to $p_{n-k-1}$ for every 2 bits in accordance with the expression indicated in FIG. 15 or 16 and outputs a resulting value as a parity bit D18.

Now, a coding process by the coding apparatus 1 of FIG. 8 is described with reference to FIG. 17. This coding process is started, for example, when an information word D11 (information word i) is inputted in a unit of two bits.

At step S1, the bit width adjustment circuit 11 sets the number s of a vector of an information word D12 to be outputted to the cyclic shift circuit 12 to 0, and then advances the processing to step S2.

At step S2, the bit width adjustment circuit 11 combines the information word D11 inputted in a unit of two bits to form an sth vector (information word D12) of six bits and supplies the sth vector to the cyclic shift circuit 12.

After the process at step S2, the processing advances to step S3, at which the cyclic shift circuit 12 cyclically shifts the sth vector based on a control signal D21 from the control section 18 to determine the product (h×i) of the value h of each row of each component matrix which is not a 0 matrix from among the component matrices of the information part of the check matrix H' and the sth vector and supplies the product as a product D13 of six bits to the adder 13.

After the process at step S3, the processing advances to step S4, at which the adder 13 determines exclusive OR of the product D13 of six bits from the cyclic shift circuit 12 and a sum D14 of six bits supplied from the RAM 14 at step S5 hereinafter described for each bit and supplies a value of six bits obtained as a result of the determination as a sum D15 to the RAM 14. It is to be noted that, since a sum D14 is not supplied from the RAM 14 at step S3 an the first cycle, the adder 13 supplies the product D13 as it is as a sum D15 to the RAM 14.

After the process at step S4, the processing advances to step S5, at which the RAM 14 stores the sum D15 from the adder 13 in a unit of six bits based on a control signal D22 from the control section 18. Further, the RAM 14 reads out the sun D15 stored already therein in a unit of six bits or two bits. The RAM 14 supplies the sum D15 read out in a unit of six bits as a sum D14 to the adder 13 or supplies the sum D15 read out in a unit of two bits as a sum D16 to the interleaver 15.

After the process at step S5, the processing advances to step S6, at which the bit width adjustment circuit 11 decides whether or not the number s of the vector is smaller than 11. If the bit width adjustment circuit 11 decides that the number s is smaller than 11, then the processing advances to step S7.

At step S7, the bit width adjustment circuit 11 increments the number s of the vector by 1. Thereafter, the processing returns to step S2 so that the processes described above are repeated.

On the other hand, if it is decided at step S6 that the number s of the vector is not smaller than 11 (equal to or greater than 11), then the processing advances to step S8. At step S8, the interleaver 15 re-arranges the order of the sums D16 supplied thereto from the RAM 14 at step S5 into an order corresponding to the check matrix H and supplies the sums D17 after the re-arrangement to the accumulator 16.

After the process at step S8, the processing advances to step S9, at which the accumulator 16 uses the sums D17 from the interleaver 15 to perform predetermined arithmetic operation and supplies a resulting parity bit p as a parity bit D18 in a unit of two bits to the selector 17. Thereafter, the processing advances to step S10.

At step S10, the selector 17 outputs all of the information words D19 inputted thereto after a delay in a unit of 2 bits as codewords D20 and outputs the parity bits D18 supplied from the accumulator 16 at step S9 in a unit of 2 bits as codewords D20 to output the codeword c, whereafter the processing is ended.

Figure 18:
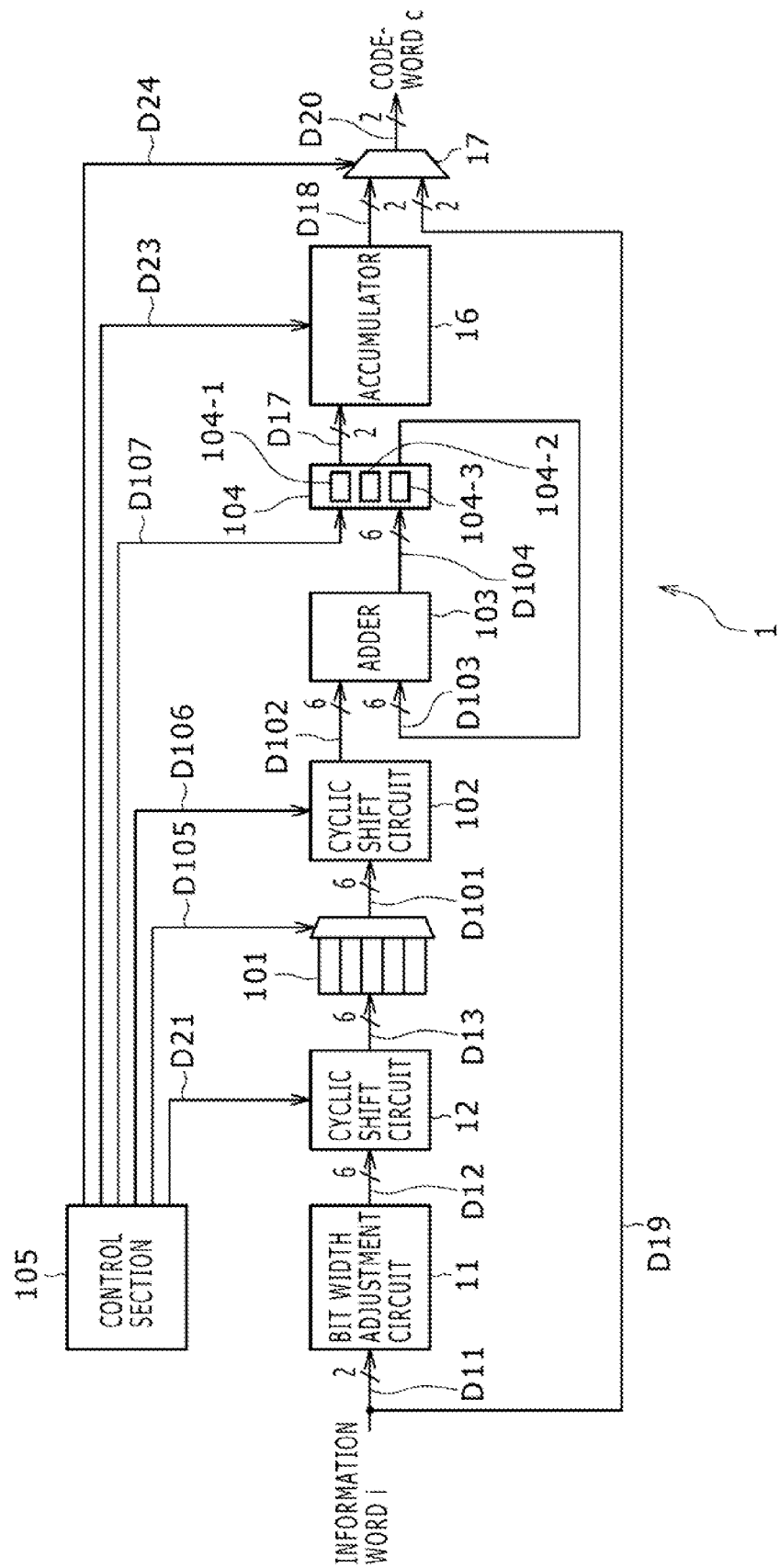
FIG. 18 is a block diagram showing an example of a configuration of a second embodiment of a coding apparatus 1 to which the present invention is applied.

FIG. 18 is a block diagram showing an example of a configuration of a second embodiment of the coding apparatus 1 to which the present invention is applied.

The coding apparatus 1 of FIG. 18 includes a bit width adjustment circuit 11, a cyclic shift circuit 12, an accumulator 16, a selector 17, a re-arrangement circuit 101, a cyclic shift circuit 102, an adder 103, a RAM 104 formed from three RAMS 104-1 to 104-3, and a control section 105. It is to be noted that like elements to those of FIG. 8 are denoted by like reference characters and description of them is omitted herein to avoid redundancy.

To the re-arrangement circuit 101, a product D13 of six bits is successively supplied from the cyclic shift circuit 12, and a control signal D105 for controlling re-arrangement is supplied from the control section 105. The re-arrangement circuit 101 performs re-arrangement of the products D13 based on the control signal D105 and supplies the products D13 after the re-arrangement as products D101 to the cyclic shift circuit 102. It is to be noted that, since the number of RAMs in the RAM 104 in the coding apparatus 1 of FIG. 18 is three and $n_0-k_0$ (=6) is a multiple of the number of RAMs of the RAM 104, the re-arrangement circuit 101 does not perform re-arrangement and supplies the products D13 to the cyclic shift circuit 102. A case wherein the number of $n_0-k_0$ is not a multiple of the number of RAMs 104 is hereinafter described with reference to FIGS. 22 to 29.

To the cyclic shift circuit 102, a control signal D106 representative of the amount of cyclic shifting is supplied from the control section 105. The cyclic shift circuit 102 cyclically shifts the products D101 from the re-arrangement circuit 101 based on the control signal D106 and supplies the products D101 in a unit of six bits after the cyclic shifting as products D102 to the adder 103.

The adder 103 determines exclusive OR of a product D102 of six bits from the cyclic shift circuit 102 and a sum D103 of six bits from the RAM 104 for each bit and supplies the value of six bits obtained as a result of the determination as a sum D104 to the RAM 104.

The number of bits of the RAM 104 is 6 (=P) and the word number is 6 (=$n_0-k_0$). The RAM 104 is formed from the three RAMS 104-1 to 104-3 whose bit number is 2 (=6/3) and whose word number is 6 (=$n_0-k_0$) and which can be controlled independently of each other. To the RAM 104, a control signal D107 for designating an address from or into which data is to be read out or written is supplied from the control section 105. The RAM 104 stores the sum D104 from the adder 103 in a unit of six bits or reads out a sum D104 stored already in a unit of six bits or two bits based on the control signal D107.

It is to be noted that, since the RAM 104 is formed from the three RAMS 104-1 to 104-3, it is possible to read out sums D104 at the same time (parallelly) from a predetermined address of the RAMS 104-1 to 104-3 or store sums D104 simultaneously into a predetermined address of the RAMS 104-1 to 104-3. The RAM 104 supplies the sum D104 read out in a unit of 6 bits as a sum D103 to the adder 103 or supplies a sum D104 read out in a unit of two bits as a sum D17 to the accumulator 16.

Further, where the RAM 104 is formed from the three RAMS 104-1 to 104-3, increase of the circuit scale of the RAM 104 from that where the RAM 104 is formed from a single RAM is so small that it can be ignored.

The control section 105 supplies a control signal D21 to the cyclic shift circuit 12, a selection signal D23 to the accumulator D23 and another selection signal D24 to the selector 17 similarly to the control section 18 of FIG. 8. Further, the control section 105 produces a control signal D105 for controlling re-arrangement in response to $n_0-k_0$ of the codeword c and the number of RAMS 104-1 to 104-3 which compose the RAM 104 and supplies the control signal D105 to the re-arrangement circuit 105. Further, the control section 105 produces a control signal D106 representative of a cyclic shift amount in response to the bit number of the RAM 104 and an address number of the RAM 104 into which a product D102 is to be stored and supplies the control signal D106 to the cyclic shift circuit 102.

The amount of cyclic shifting performed by the cyclic shift circuit 102 of FIG. 18 is described with reference to FIG. 19.

It is to be noted that, in the following description, the product of the wth row from above of the vth component matrices from above of the check matrix H' outputted from the cyclic shift circuit 12 as the product D13 and the zeroth vector is represented also as $d_{w,v}$.

The control section 105 repetitively sets the cyclic shift amount in order of y×0, y×1, y≦2, ..., y×($n_0-k_0-1$) (mod P) based on the bit number y (in the present case, 2) of the RAMS 104-1 to 104-3 and the address number (0, 1, ..., $n_0-k_0-1$) of the RAM into which the product D102 (D101) is to be stored. Then, the control section 105 produces a control signal D106 representative of the cyclic shift amount and supplies the control signal D106 to the cyclic shift circuit 102. In the present case, since the bit number y is 2, the control section 105 repetitively sets the cyclic shift amount in order of 0, 2, 4, 0, 2, 4.

Figure 19:
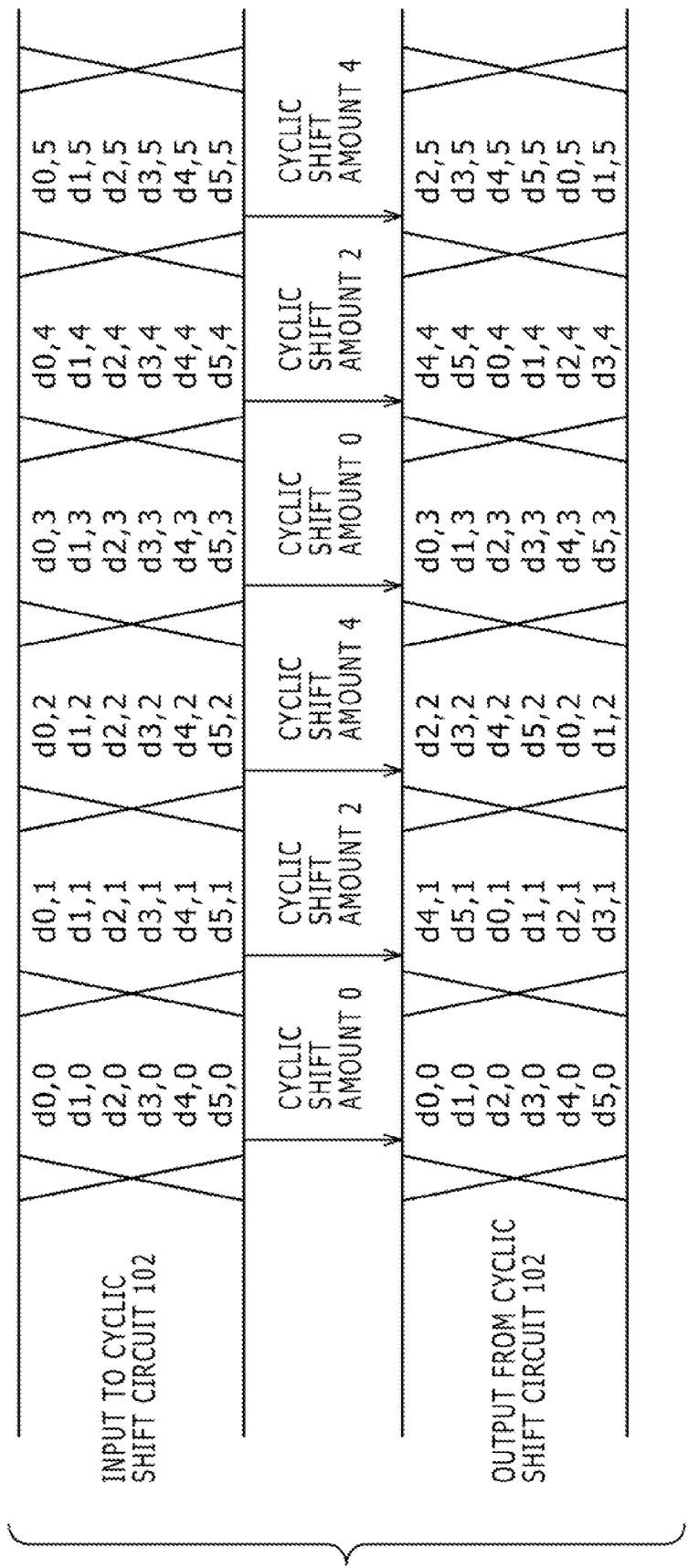
FIG. 19 is a view illustrating the amount of cyclic shifting performed by a cyclic shift circuit of FIG. 18.

In particular, as seen in FIG. 19, the cyclic shift circuit 102 outputs $d_{0,0}$ to $d_{5,0}$ of the products D101 of six bits supplied thereto from the cyclic shift circuit 12 through the re-arrangement circuit 101 as products D102 to the adder 103 without cyclically shifting them. In other words, the cyclic shift amount of $d_{0,0}$ to $d_{5,0}$ is 0.

Further, the cyclic shift circuit 102 cyclically shifts $d_{0,1}$ to $d_{5,1}$ of the products D101 of six bits supplied thereto from the cyclic shift circuit 12 through the re-arrangement circuit 101 by two and outputs resulting values as products D102 to the adder 103. In other words, the products D102 of six bits which include $d_{4,1}, d_{5,1}, d_{0,1}, d_{1,1}, d_{2,1}, d_{3,1}$ arranged in order are supplied from the adder 103 to the adder 103.

Further, the cyclic shift circuit 102 cyclically shifts $d_{0,2}$ to $d_{5,2}$ of the products D101 of 6 bits supplied thereto from the cyclic shift circuit 12 through the re-arrangement circuit 101 by four and outputs resulting values as products D102 to the adder 103. In other words, the products D102 of six bits which include $d_{2,2}, d_{3,2}, d_{4,2}, d_{5,2}, d_{0,2}, d_{1,2}$ arranged in order are supplied from the adder 103 to the adder 103.

Thereafter, the cyclic shift amount is set in order of 0, 2, 4 and cyclic shifting of $d_{0,2}$ to $d_{5,2}, d_{0,2}$ to $d_{5,2}$, and $d_{0,2}$ to $d_{5,2}$ is performed in a similar manner.

In FIG. 19, the case of $d_{w,v}$ which is the products of the wth row from above of the vth component matrices from above of the check matrix H' and the zeroth vector is described. However, cyclic shifting is performed similarly also for the products D101 of the wth row from above of the vth component matrix from above of the check matrix H' and the first to eleventh vectors.

Now, the sums D104 stored in the RAM 104 of FIG. 18 are described with reference to FIG. 20.

As seen in FIG. 19, to the RAM 104, $d_{0,0}$ to $d_{5,0}$ of the zeroth vector and the zeroth component matrices from above of the check matrix H' are supplied as sums D104 of 6 bits from the cyclic shift circuit 102 through the adder 103. The RAM 104 stores the bits of the sums D104 in order into the zeroth address of the RAMS 104-1 to 104-3 as seen in FIG. 20 based on the control signal D107. More particularly, $d_{0,0}$ is stored into the zeroth bit of the RAM 104-1; $d_{1,0}$ is stored into the first bit; $d_{2,0}$ is stored into the zeroth bit of the RAM 104-2; and $d_{3,0}$ is stored into the first bit. Further, $d_{4,0}$ is stored into the zeroth bit of the RAM 104-3; and $d_{5,0}$ is stored into the first bit. Thereafter, the RAM 104 stores the sums D104 in order into the first to fifth addresses of the RAMS 104-1 to 104-3 based on the control signal D107 in a similar manner.

Further, the RAM 104 reads out $d_{0,0}$ to $d_{5,0}$ stored in the zeroth and first bits of the zeroth address of the RAMS 104-1 to 104-3 and supplies them as a sum D103 of six bits to the adder 103. Thereafter, the RAM 104 reads out the sums D104 of six bits stored in the first to fifth addresses of the RAMS 104-1 to 104-3 and supplies them as the sum D103 to the adder 103 in a similar manner.

The adder 103 performs EXOR arithmetic operation of $d_{0,0}$ to $d_{5,0}$ which are products of the zeroth vector supplied as the sum D103 of six bits from the RAM 104 and the zeroth component matrices from above of the check matrix H' and the products of the first vector supplied from the cyclic shift circuit 102 and the zeroth component matrices from above of the check matrix H'. Then, the adder 103 supplies a sum D104 obtained as a result of the EXOR arithmetic operation to the RAM 104. The RAMS 104-1 to 104-3 of the RAM 104 successively store the bits of the sum D104 into the zeroth address. In other words, the RAMS 104-1 to 104-3 update the zeroth address. Thereafter, the RAMS 104-1 to 104-3 update also the first to fifth addresses similarly.

Then, a similar process is repeated, and $o_{0,0}$ which is the products of the zeroth row from above of the zeroth component matrices from above of the check matrix H' and the zeroth to 11th vectors is stored into the zeroth bit of the zeroth address of the RAM 104-1. Further, $o_{1,0}$ is stored into the first bit of the zeroth address of the RAM 104-1, and $o_{2,0}$ is stored into the zeroth bit of the zeroth address of the RAM 104-2 and $o_{3,0}$ is stored into the first bit. Further, $o_{4,0}$ and $o_{5,0}$ are stored into the zeroth bit and the first bit of the zeroth address of the RAM 104-3.

Similarly, $o_{4,1}, o_{5,1}, o_{0,1}, o_{1,1}, o_{2,1}$ and $o_{3,1}$ are stored into the first address of the RAMS 104-1 to 104-3; $o_{2,2}, o_{3,2}, o_{4,2}, o_{5,2}, o_{0,2}$ and $o_{1,2}$ are stored into the second address; $o_{0,3}, o_{1,3}, o_{2,3}, o_{3,3}, o_{4,3}$ and $o_{5,3}$ are stored into the third address of the RAM 104; $o_{4,4}, o_{5,4}, o_{0,4}, o_{1,4}, o_{2,4}$ and $o_{3,4}$ are stored into the fourth address of the RAM 104; and $o_{2,5}, o_{3,5}, o_{4,5}, o_{5,5}, o_{0,5}$ and $o_{1,5}$ are stored into the fifth address.

Further, the RAM 104 successively reads out $o_{0,0}$ to stored already therein beginning with that which corresponds to the first row of the check matrix H based on the control signal D107. In particular, the RAM 104 reads out $o_{0,0}$ stored in the zeroth bit of the zeroth address of the RAM 104-1 and $o_{0,1}$ stored in the first bit of the first address of the RAM 104-2, and supplies the values as a sum D17 of two bits to the accumulator 16.

Then, the RAM 104 reads out $o_{0,2}$ stored in the zeroth bit of the second address of the RAM 104-3 and $o_{0,3}$ stored in the zeroth bit of the third address of the RAM 104-1, and supplies the values as a sum D17 of two bits to the accumulator 16. Then, the RAM 104 reads out $o_{0,4}$ stored in the zeroth bit of the fourth address of the RAM 104-2 and $o_{0,5}$ stored in the zeroth bit of the fifth address of the RAM 104-3, and supplies the values as a sum D17 of two bits to the accumulator 16.

Further, the RAM 104 reads out $o_{1,0}$ stored in the first bit of the zeroth address of the RAM 104-1 and $o_{1,1}$ stored in the first bit of the first address of the RAM 104-2, $o_{1,2}$ stored in the first bit of the second address of the RAM 104-3 and $o_{1,3}$ stored in the first bit of the third address of the RAM 104-1, and $o_{1,4}$ stored in the first bit of the fourth address of the RAM 104-2 and $o_{1,5}$ stored in the first bit of the fifth address of the RAM 104-3 for each two in this order, and supplies the values as a sum D17 of two bits to the accumulator 16.

Then, the RAM 104 reads out $o_{2,0}$ stored in the zeroth bit of the zeroth address of the RAM 104-2 and $o_{2,1}$ stored in the zeroth bit of the first address of the RAM 104-3, $o_{2,2}$ stored in the zeroth bit of the second address of the RAM 104-1 and $o_{2,3}$ stored in the zeroth bit of the third address of the RAM 104-2, and $o_{2,4}$ stored in the zeroth bit of the fourth address of the RAM 104-3 and $o_{2,5}$ stored in the zeroth bit of the fifth address of the RAM 104-1 for each two in this order, and supplies the values as a sum D17 of two bits to the accumulator 16.

Further, the RAM 104 reads out $o_{3,0}$ stored in the first bit of the zeroth address of the RAM 104-2 and $o_{3,1}$ stored in the first bit of the first address of the RAM 104-3, $o_{3,2}$ stored in the first bit of the second address of the RAM 104-1 and $o_{3,3}$ stored in the first bit of the third address of the RAM 104-2, $o_{3,4}$ stored in the first bit of the fourth address of the RAM 104-3 and $o_{3,5}$ stored in the first bit of the fifth address of the RAM 104-1 for each two in this order, and supplies the values as a sum D17 of two bits to the accumulator 16.

Then, the RAM 104 reads out $o_{4,0}$ stored in the zeroth bit of the zeroth address of the RAM 104-3 and $o_{4,1}$ stored in the zeroth bit of the first address of the RAM 104-1, $o_{4,2}$ stored in the zeroth bit of the second address of the RAM 104-2 and $o_{4,3}$ stored in the zeroth bit of the third address of the RAM 104-3, $o_{4,4}$ stored in the zeroth bit of the fourth address of the RAM 104-1 and $o_{4,5}$ stored in the zeroth bit of the fifth address of the RAM 104-2 for each two in this order, and supplies the values as a sum D17 of two bits to the accumulator 16.

Further, the RAM 104 reads out $o_{5,0}$ stored in the first bit of the zeroth address of the RAM 104-3 and $o_{5,1}$ stored in the first bit of the first address of the RAM 104-1, $o_{5,2}$ stored in the first bit of the second address of the RAM 104-2 and $o_{5,3}$ stored in the first bit of the third address of the RAM 104-3, $o_{5,4}$ stored in the first bit of the fourth address of the RAM 104-1 and $o_{5,5}$ stored in the first bit of the fifth address of the RAM 104-2 for each two in this order, and supplies the values as a sum D17 of two bits to the accumulator 16.

As described hereinabove with reference to FIG. 19, since the cyclic shift circuit 102 cyclically shifts the products D101, the sums D104 of two bits read out at the same time by the RAM 104 can be stored into different ones of the RAMS 104-1 to 104-3. Consequently, reading out substantially in the word direction can be performed from the RAM 104 which does not allow reading out in the word direction. For example, while $o_{0,0}$ and $o_{0,1}$ which are read out simultaneously as a sum D104 of two bits are stored in a juxtaposed relationship in the word direction, since they are stored in the different RAMs 104-1 and 104-2, they can be read out simultaneously.

As a result, the produces of each row of the information part of the check matrix H' stored in order as sums D104 beginning with the zeroth row of the check matrix H' in the bit direction of the RAM 104 and information words i can be read out in order beginning with the products corresponding to the zeroth row of the check matrix H.

Figure 21:
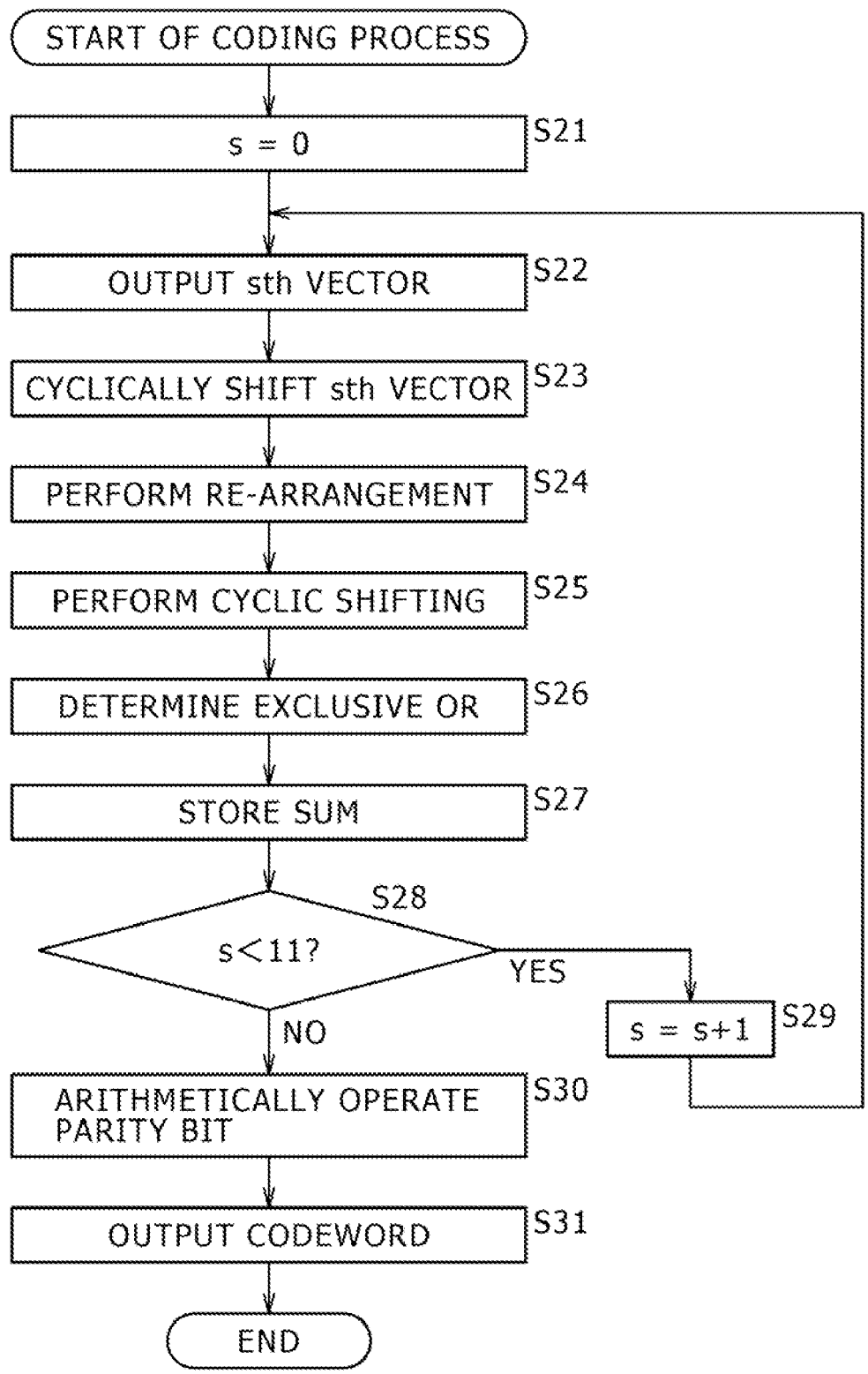
FIG. 21 is a flow chart illustrating a coding process by the coding apparatus of FIG. 18.

Now, a coding process by the coding apparatus 1 of FIG. 18 is described with reference to FIG. 21. This coding process is started, for example, when an information word D11 (information word i) is inputted in a unit of two bits.

Figure 17:
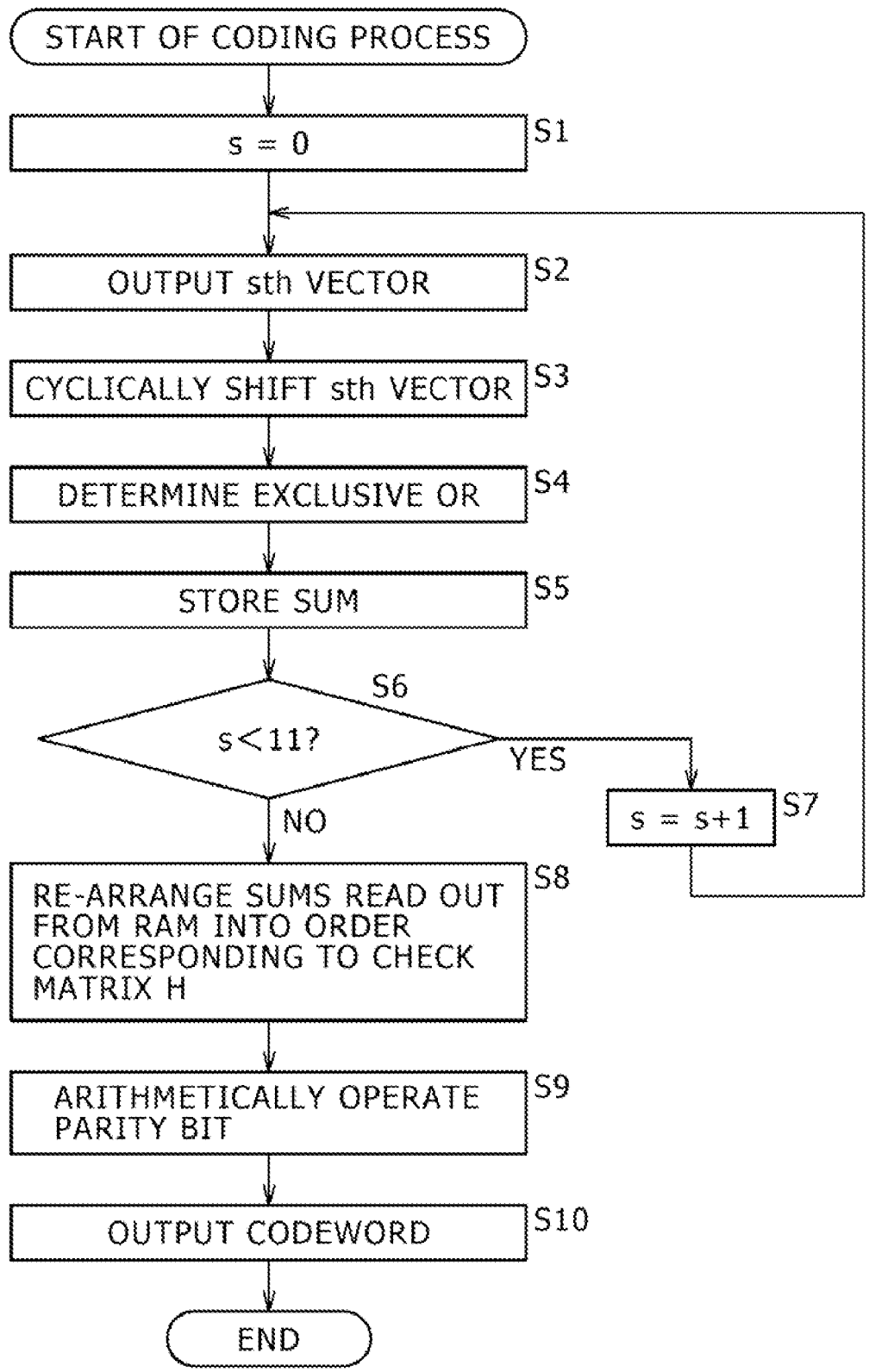
FIG. 17 is a flow chart illustrating a coding process by the coding apparatus of FIG. 8.

Processes at steps S21 to S23 are similar to those at steps S1 to S3 of FIG. 17, and therefore, description thereof is omitted herein.

After the process at step S23, the processing advances to step S24, at which the re-arrangement circuit 101 performs re-arrangement of the products D13 of six bits supplied from the cyclic shift circuit 12 at step S23 based on a control signal D105 from the control section 105 and supplies the products D13 after the re-arrangement as products D101 to the cyclic shift circuit 102.

After the process at step S24, the processing advances to step S25, at which the cyclic shift circuit 102 cyclically shifts the products D101 from the re-arrangement circuit 101 based on the control signal D106 from the control section 105 and supplies the products D101 in a unit of six bits after the cyclic shifting as products D102 to the adder 103.

After the process at step S25, the processing advances to step S26, at which the adder 103 determines exclusive OR of the products D102 of six bits from the cyclic shift circuit 102 and the sums D103 of six bits supplied from the RAM 104 at step S27 described below for each bit and supplies values of six bits obtained by the determination as sums D104 to the RAM 104. Thereafter, the processing advances to step S27.

At step S27, the RAM 104 stores the sums D104 from the adder 103 in a unit of six bits or reads out the sums D104 stored already therein in a unit of six bits or two bits based on the control signal D107 from the control section 105. The RAM 104 supplies the sums D104 read out in a unit of 6 bits as sums D103 to the adder 103 or supplies the sums D104 read out in a unit of 2 bits as D17 to the accumulator 16.

Processes at steps S28 to S31 are similar to those at steps S6, S7, S9 and S10, and therefore, description of them is omitted herein.

Figure 22:
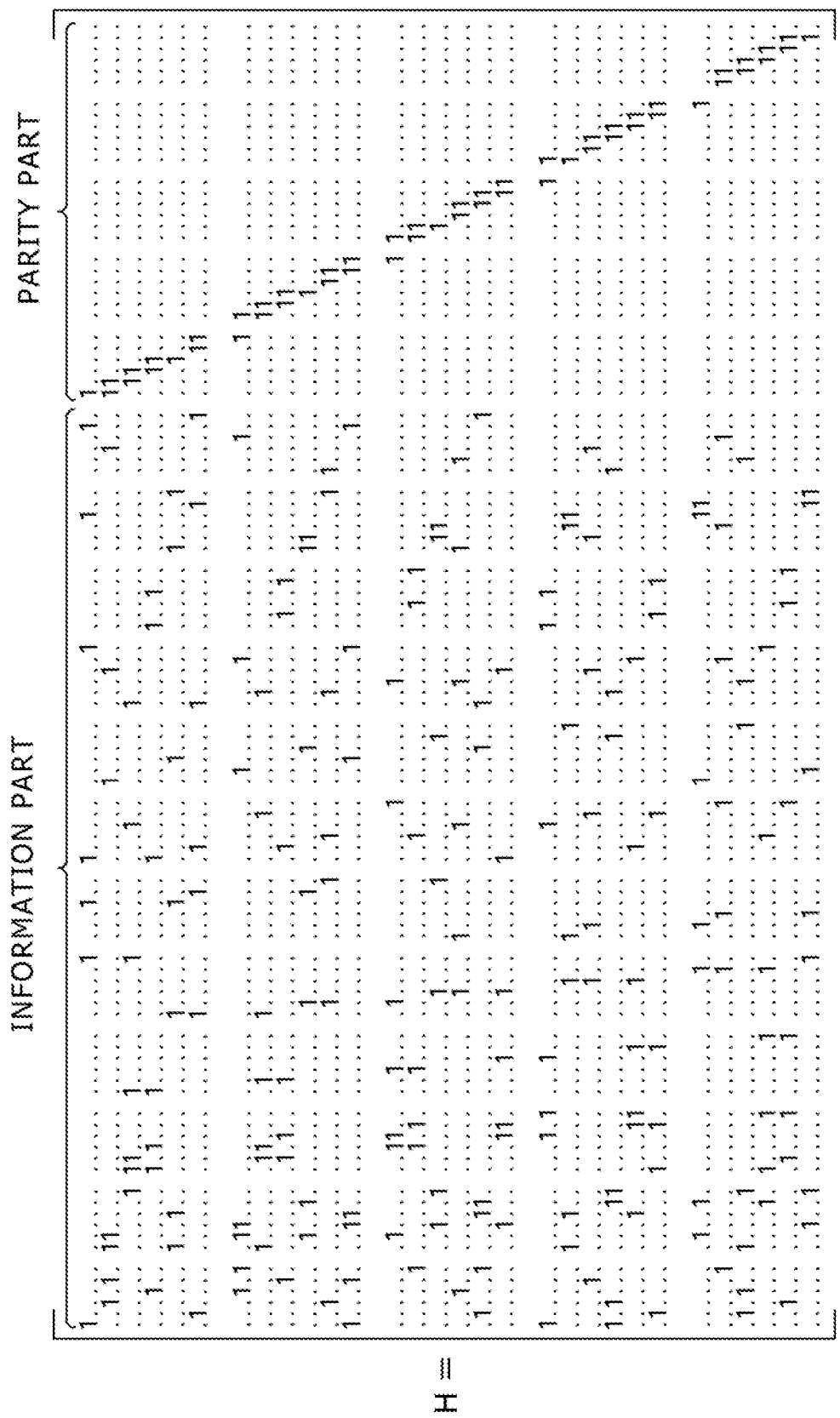
FIG. 22 is a view illustrating another example of a check matrix H used in LDPC coding.

FIG. 22 shows another example of a check matrix H used for LDPC coding.

Figure 23:
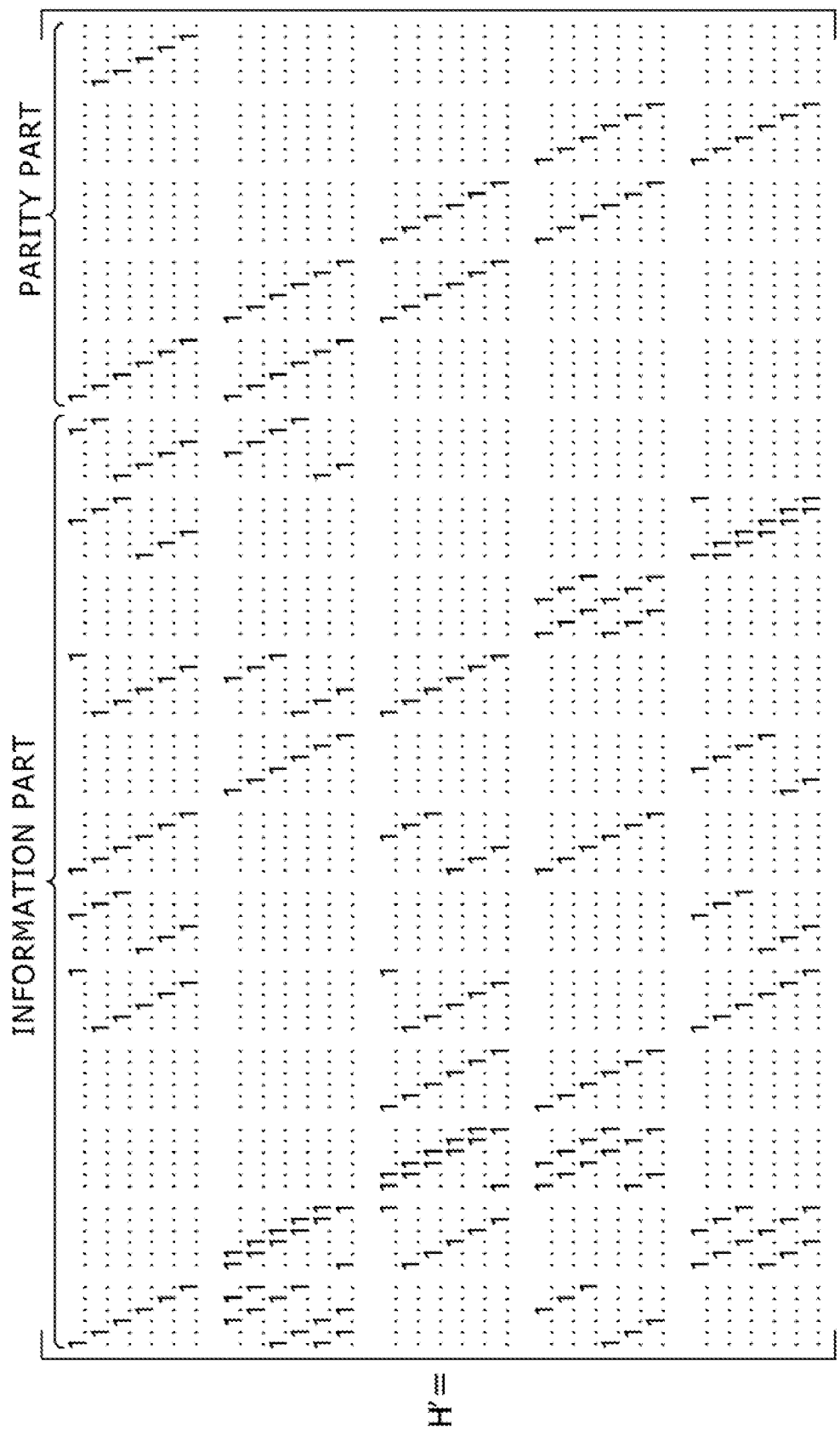
FIG. 23 is a view illustrating a check matrix H' after row permutation or column permutation of the check matrix H of FIG. 22 is performed.

The check matrix H of FIG. 22 is a check matrix for obtaining a codeword c of n=102 and k=72 (coding rate 12/17, code length 102) and a matrix of 30 (rows)×102 (columns). In particular, the check matrix H is composed of an information part of 30 (=n−k) rows and 72 (=k) columns, and a parity part of 30 (=n−k) rows and 30 (=n−k) columns. If the check matrix H of FIG. 22 undergoes row permutation or column permutation, then a check matrix H' shown in FIG. 23 is obtained. In the check matrix H' of FIG. 23, the information part can be represented as a combination of component matrices.

Now, processing of the re-arrangement circuit 101, cyclic shift circuit 102 and RAM 104 where the coding apparatus 1 of FIG. 18 performs LDPC coding using the check matrix H of FIG. 22 is described with reference to FIGS. 24 and 25.

First, processing of the re-arrangement circuit 101 and the cyclic shift circuit 102 is described with reference to FIG. 24.

Figure 24:
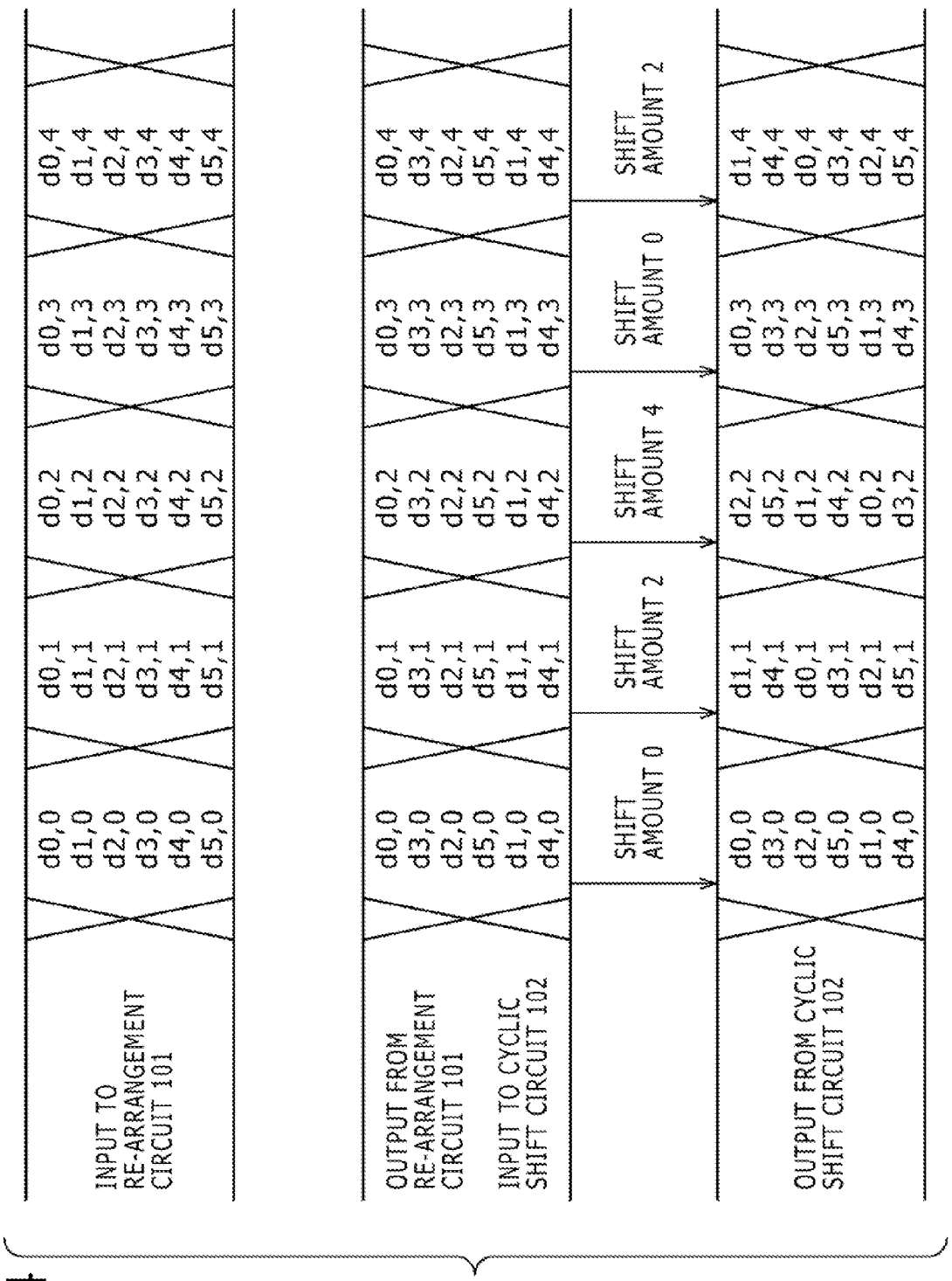
FIG. 24 is a view illustrating a process where the check matrix H of FIG. 22 is used to perform LDCP coding.

As seen in FIG. 24, $d_{0,0}$ to $d_{5,0}$, $d_{0,1}$ to $d_{5,1}$, $d_{0,2}$ to $d_{5,2}$, $d_{0,3}$ to $d_{5,3}$, $d_{0,4}$ to $d_{5,4}$, and $d_{0,5}$ to $d_{5,5}$ which are products of six bits are first supplied in order as products D13 from the cyclic shift circuit 12 to the re-arrangement circuit 101.

Here, $n_0-k_0$ (=(n−k)/P=30/6) is 5 and is not a multiple of 3 which is the number of RAMS 104-1 to 104-3 but exhibits a remainder of 2 when it is divided by 3. Where $n_0-k_0$ is not a multiple of the RAMS 104-1 to 104-3 but exhibits a remainder of 2 when it is divided by 3 in this manner, the re-arrangement circuit 101 performs re-arrangement in the following manner so that the RAM 104 may read out the products of the rows of the information part of the check matrix H' and the information words i in order beginning with the products corresponding to the zeroth row of the check matrix H.

The re-arrangement circuit 101 re-arranges the zeroth bit of the products D13 into the zeroth bit of the products D101; re-arranges the third bit of the products D13 into the first bit of the products D101; re-arranges the second bit of the products D13 into the second bit of the products D101; re-arranges the fifth bit of the products D13 into the third bit of the products D101; re-arranges the first bit of the products D13 into the fourth bit of the products D101; and re-arranges the fourth bit of the products D13 into the fifth bit of the products D101. Then, the re-arrangement circuit 101 supplies the products D101 of the six bits to the cyclic shift circuit 102.

For example, the re-arrangement circuit 101 re-arranges $d_{0,0}$ to $d_{5,0}$ of six bits into the order of $d_{0,0}$, $d_{3,0}$, $d_{2,0}$, $d_{5,0}$, $d_{1,0}$ and $d_{4,0}$ as seen in FIG. 24 and supplies them as products D101 to the cyclic shift circuit 102. Further, the re-arrangement circuit 101 re-arranges $d_{0,1}$ to $d_{5,1}$ of six bits into the order of $d_{0,1}$, $d_{3,1}$, $d_{2,1}$, $d_{5,1}$ $d_{1,1}$ and $d_{4,1}$ as seen in FIG. 24 and supplies them as products D101 to the cyclic shift circuit 102.

As seen in FIG. 24, the control section 105 repetitively sets the cyclic shift amount to y×0, y×1, y×2, . . . , y×($n_0-k_0-1$)

(mod P) in this order, that is, in the order of 0, 2, 4, 0, 2, and produces and supplies a control signal D106 representative of the amount of cyclic shifting to the cyclic shift circuit 102.

The cyclic shift circuit 102 outputs, for example, $d_{0,0}$, $d_{3,0}$, $d_{2,0}$, $d_{5,0}$, $d_{1,0}$ and $d_{4,0}$ supplied thereto as the products D101 of six bits from the re-arrangement circuit 101 as products D102 to the adder 103 without cyclically shifting them based on the control signal D106 from the control section 105. In other words, the cyclic shift amount of $d_{0,0}$ to $d_{5,0}$ is 0.

It is to be noted that re-arrangement and cyclic shifting are performed similarly also for the products D101 of the wth row from above of the vth component matrices from above of the check matrix H' and the first to eleventh vectors.

Now, processing of the RAM 104 is described with reference to FIG. 25.

Figure 25:
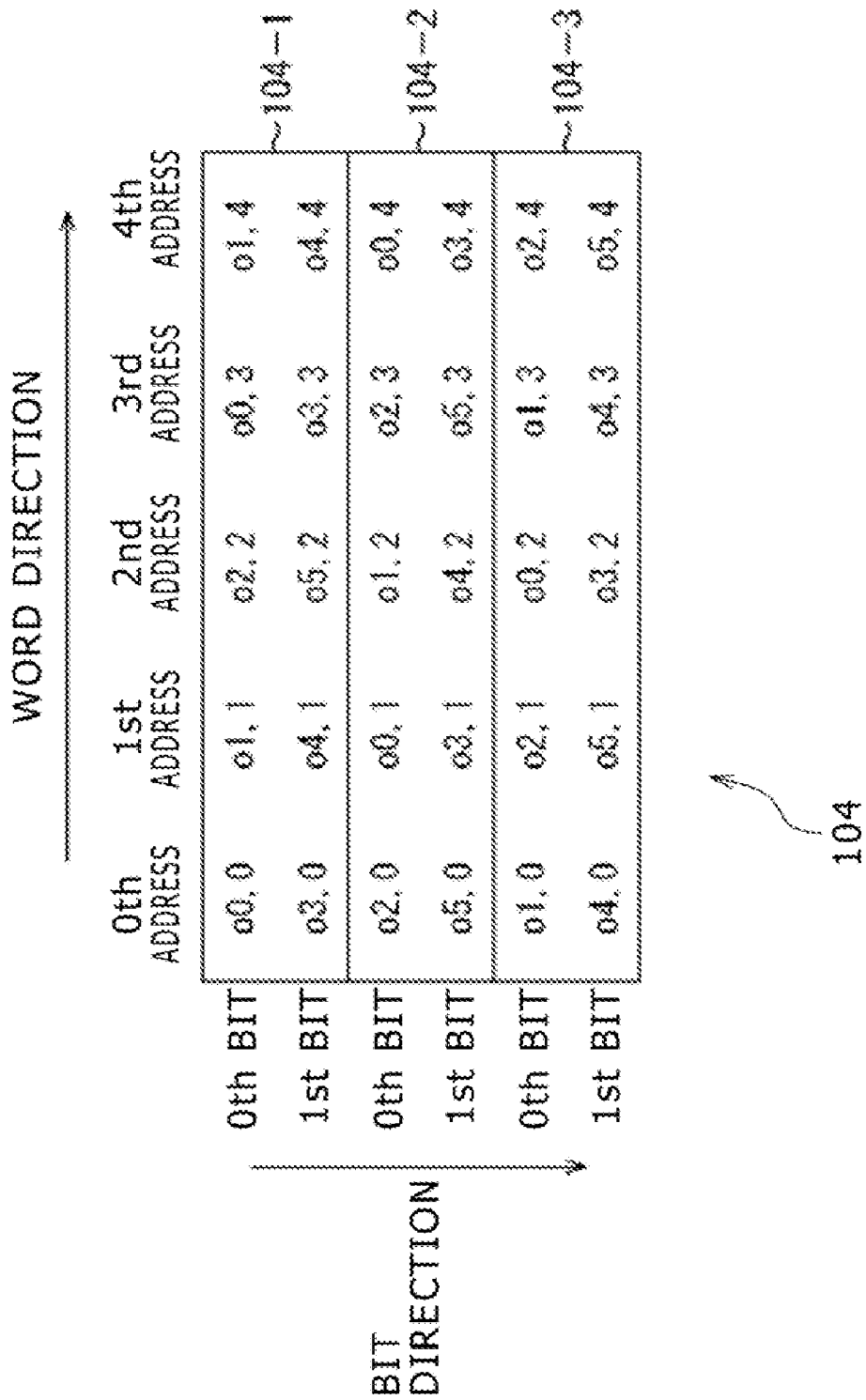
FIG. 25 is a view illustrating a process where the check matrix H of FIG. 22 is used to perform LDCP coding.

The RAM 104 repeats storage (updating) and reading out of sums D104 of six bits supplied from the adder 103 based on the control signal D107, and finally, $o_{0,0}$ to $o_{5,4}$ are stored into the RAM 104 as seen in FIG. 25.

For example, $o_{0,0}$ is stored into the zeroth bit of the zeroth address of the RAM 104-1, and $o_{3,0}$ is stored into the first bit of the zeroth address of the RAM 104-1. Further, $o_{2,0}$ is stored into the zeroth bit of the zeroth address of the RAM 104-2, and $o_{5,0}$ is stored into the first bit. Furthermore, $o_{1,0}$ is stored into the zeroth bit of the zeroth address of the RAM 104-3, and $o_{4,0}$ is stored into the first bit.

Further, the RAM 104 reads out $o_{0,0}$ to $o_{5,4}$ stored already therein in order beginning with that which corresponds to the first row of the check matrix H based on the control signal D107 similarly as in the case of FIG. 20.

In particular, the RAM 104 reads out $o_{0,0}$ stored in the zeroth bit of the zeroth address of the RAM 104-1 and $o_{0,1}$ stored in the first bit of the first address of the RAM 104-2, and supplies the values as a sum D17 of two bits to the accumulator 16.

Then, the RAM 104 reads out $o_{0,2}$ stored in the zeroth bit of the second address of the RAM 104-3 and $o_{0,3}$ stored in the zeroth bit of the third address of the RAM 104-1, and supplies the values as a sum D17 of two bits to the accumulator 16.

Then, the RAM 104 reads out $o_{0,4}$ stored in the zeroth bit of the fourth address of the RAM 104-2 and $o_{1,0}$ stored in the zeroth bit of the zeroth address of the RAM 104-3, $o_{1,1}$ stored in the zeroth bit of the first address of the RAM 104-1 and $o_{1,2}$ stored in the zeroth bit of the second address of the RAM 104-2, and $o_{1,3}$ stored in the zeroth bit of the third address of the RAM 104-3 and $o_{1,4}$ stored in the zeroth bit of the fourth address of the RAM 104-1 for each two in this order, and supplies the values as sums D17 of 2 bits to the accumulator 16.

Then, the RAM 104 reads out $o_{2,0}$ stored in the zeroth bit of the zeroth address of the RAM 104-2 and $o_{2,1}$ stored in the zeroth bit of the first address of the RAM 104-3, and $o_{2,2}$ stored in the zeroth bit of the second address of the RAM 104-1 and $o_{2,3}$ stored in the zeroth bit of the third address of the RAM 104-2 for each two in this order, and supplies the values as sums D17 of two bits to the accumulator 16.

Further, the RAM 104 reads out $o_{2,4}$ stored in the zeroth bit of the fourth address of the RAM 104-3 and $o_{3,0}$ stored in the first bit of the zeroth address of the RAM 104-1, $o_{3,1}$ stored in the first bit of the first address of the RAM 104-2 and $o_{3,2}$ stored in the first bit of the second address of the RAM 104-3, and $o_{3,3}$ stored in the first bit of the third address of the RAM 104-1 and $o_{3,4}$ stored in the first bit of the fourth address of the RAM 104-2 for each two in this order, and supplies the values as sums D17 of two bits to the accumulator 16.

Then, the RAM 104 reads out $o_{4,0}$ stored in the zeroth bit of the zeroth address of the RAM 104-3 and $o_{4,1}$ stored in the zeroth bit of the first address of the RAM 104-1, and $o_{4,2}$ stored in the zeroth bit of the second address of the RAM 104-2 and $o_{4,3}$ stored in the zeroth bit of the third address of the RAM 104-3 for each two in this order, and supplies the values as sums D17 of two bits to the accumulator 16.

Further, the RAM 104 reads out $o_{4,4}$ stored in the first bit of the fourth address of the RAM 104-1 and $o_{5,0}$ stored in the first bit of the zeroth address of the RAM 104-2, $o_{5,1}$ stored in the first bit of the first address of the RAM 104-3 and $o_{5,2}$ stored in the first bit of the second address of the RAM 104-1, and $o_{5,3}$ stored in the first bit of the third address of the RAM 104-2 and $o_{5,4}$ stored in the first bit of the fourth address of the RAM 104-3 for each two in this order, and supplies the values as sums D17 of two bits to the accumulator 16.

As described hereinabove with reference to FIG. 24, since the re-arrangement circuit 101 re-arranges the products D13 and the cyclic shift circuit 102 cyclically shifts the products D101 after the re-arrangement, the sums D104 of two bits read out at the same time by the RAM 104 can be stored into different ones of the RAMS 104-1 to 104-3.

Figure 26:
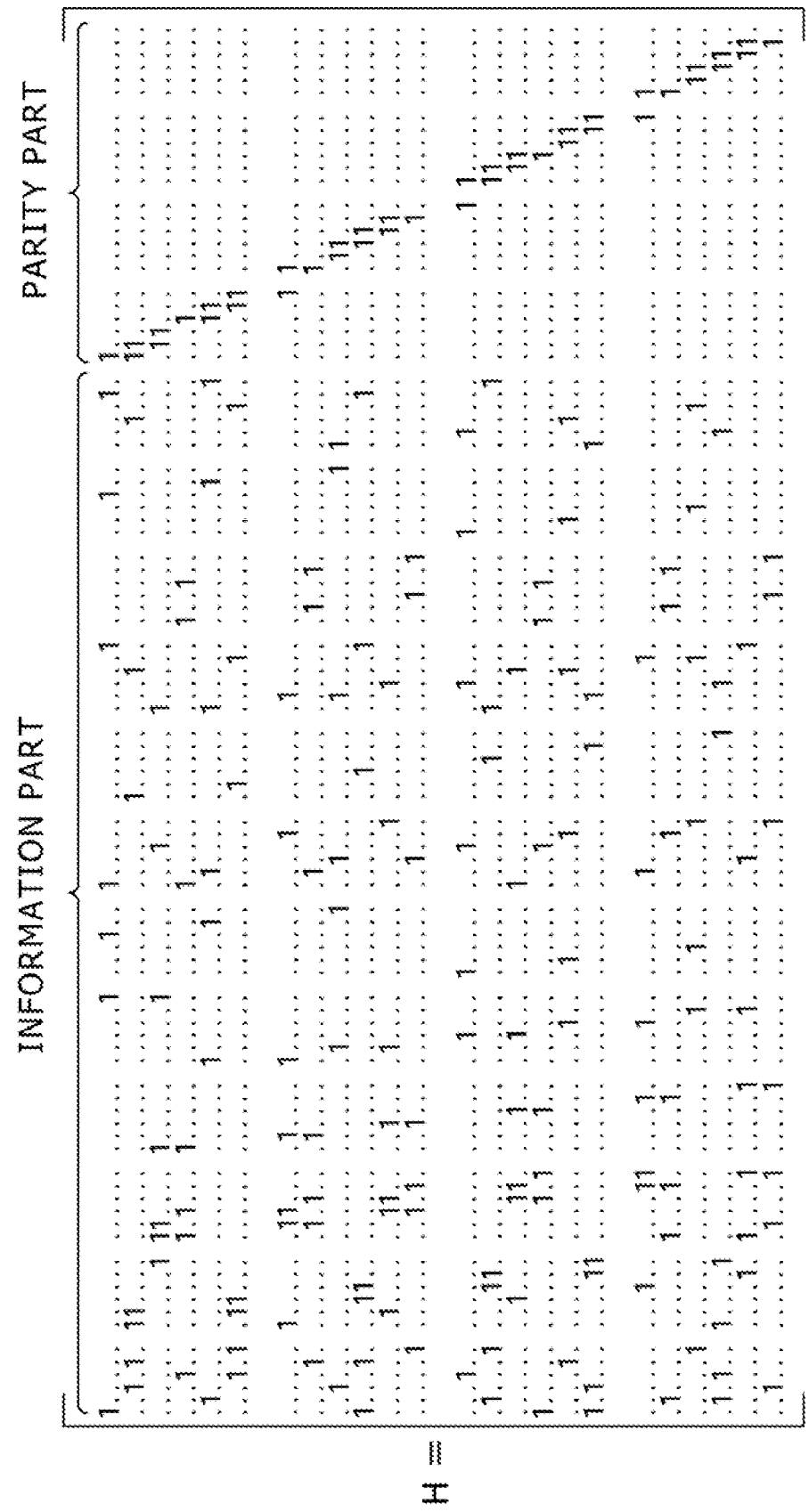
FIG. 26 is a view illustrating a further example of the check matrix H used in LDPC coding.

FIG. 26 shows a further example of the check matrix H used for LDPC coding.

Figure 27:
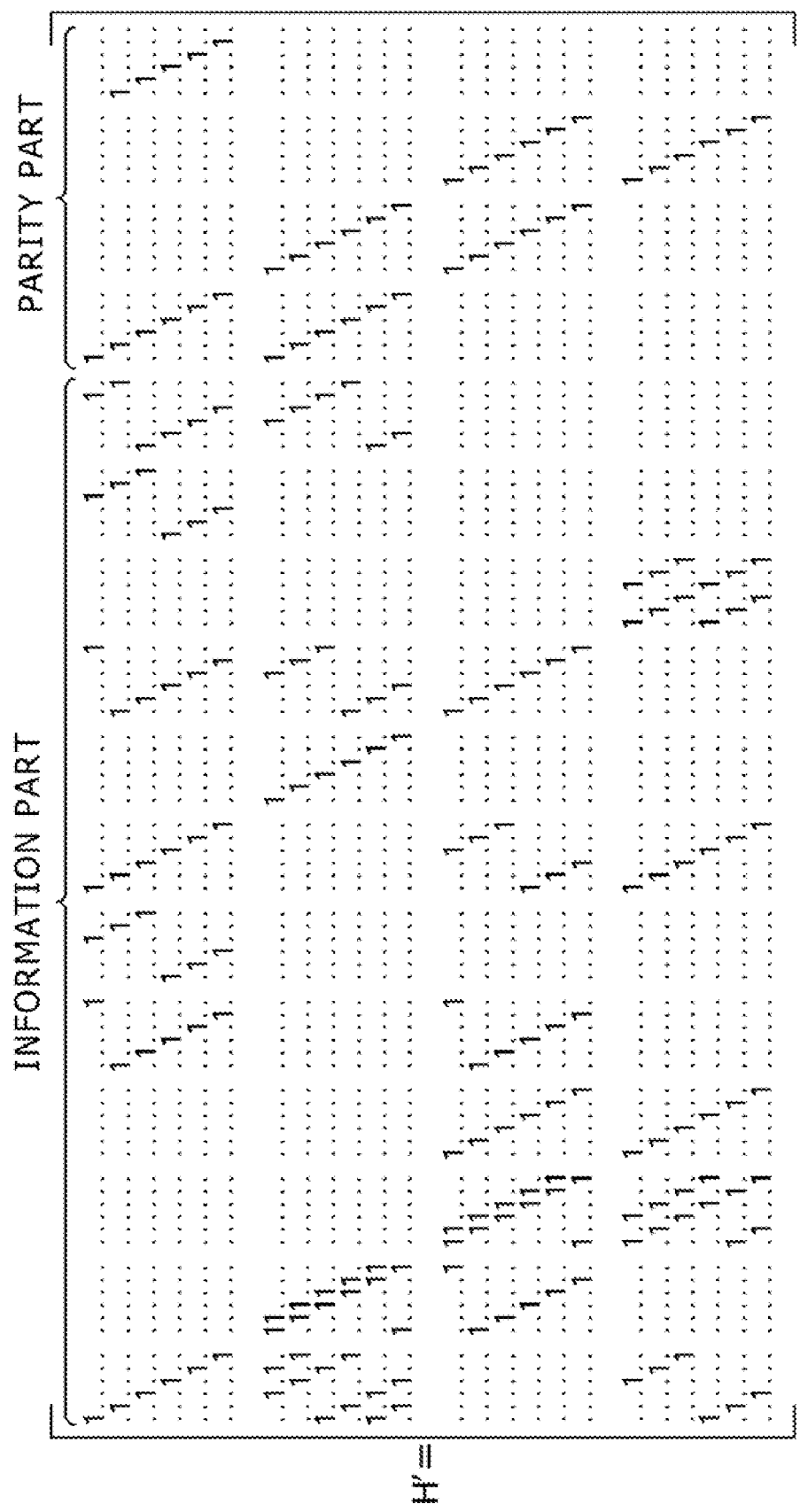
FIG. 27 is a view illustrating a check matrix H' after row permutation or column permutation of the check matrix H of FIG. 26 is performed.

The check matrix H of FIG. 26 is a check matrix H for obtaining a codeword c of n=96 and k=72 (coding rate ¾ and code length 96) and is a matrix of 24 (rows)×96 (columns). In particular, the check matrix H is composed of an information part of 24 (=n−k) rows and 72 (=k) rows, and a parity part of 24 (=n−k) rows and 24 (=n−k) columns. If the check matrix H of FIG. 26 undergoes row permutation or column permutation, then a check matrix H' illustrated in FIG. 27 is obtained. In the check matrix H' of FIG. 27, the information part can be represented by a combination of component matrices. In the following, processing of the re-arrangement circuit 101, cyclic shift circuit 102 and RAM 104 where the coding apparatus 1 of FIG. 18 performs LDPC coding using the check matrix H of FIG. 26 is described with reference to FIGS. 28 and 29.

First, processing of the re-arrangement circuit 101 and the cyclic shift circuit 102 is described with reference to FIG. 28.

Figure 28:
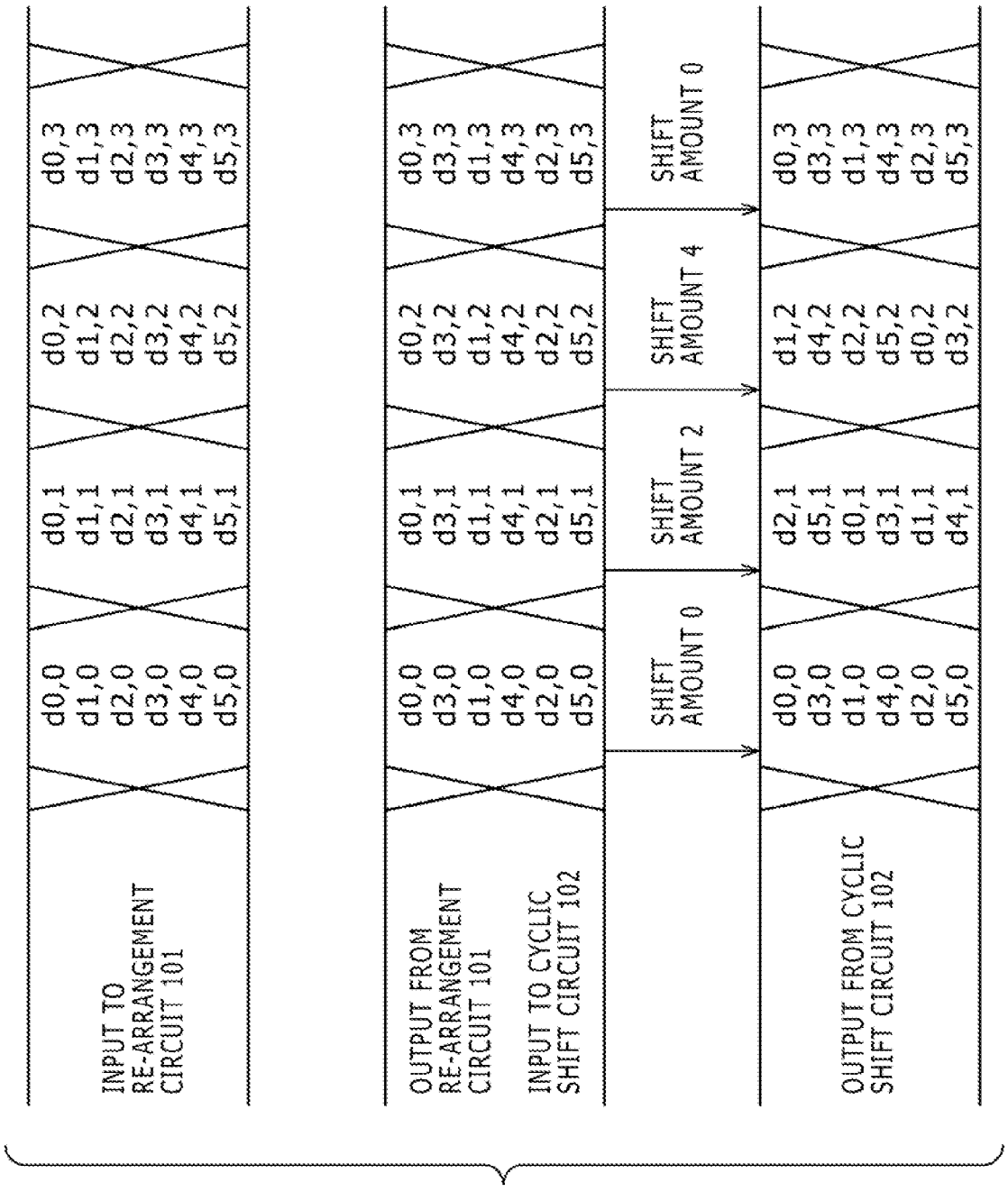
FIG. 28 is a view illustrating a process where the check matrix H of FIG. 26 is used to perform LDCP coding.

As seen in FIG. 28, $d_{0,0}$ to $d_{5,0}$, $d_{0,1}$ to $d_{5,1}$, $d_{0,2}$ to $d_{5,2}$, $d_{0,3}$ to $d_{5,3}$, $d_{0,4}$ to $d_{5,4}$, and $d_{0,5}$ to $d_{5,5}$ are supplied in order as products D13 from the cyclic shift circuit 12 to the re-arrangement circuit 101.

Here, $n_0-k_0$ (=(n−k)/P=30/6) is 4 and is not a multiple of 3 which is the number of RAMS 104-1 to 104-3 but exhibits a remainder of 1 when it is divided by 3. Where $n_0-k_0$ is not a multiple of the RAMS 104-1 to 104-3 but exhibits a remainder of 1 when it is divided by 3 in this manner, the re-arrangement circuit 101 performs re-arrangement in the following manner so that the RAM 104 may read out the products of the rows of the information part of the check matrix H' and the information words i in order beginning with the product corresponding to the zeroth row of the check matrix H.

The re-arrangement circuit 101 re-arranges the zeroth bit of the products D13 into the zeroth bit of the products D101; re-arranges the third bit of the products D13 into the first bit of the products D101; re-arranges the first bit of the products D13 into the second bit of the products D101; re-arranges the fourth bit of the products D13 into the third bit of the products D101; re-arranges the second bit of the products D13 into the fourth bit of the products D101; and re-arranges the fifth bit of the information word D13 into the fifth bit of the products D101. Then, the re-arrangement circuit 101 supplies the products D101 of six bits to the cyclic shift circuit 102.

For example, the re-arrangement circuit 101 re-arranges $d_{0,0}$ to $d_{5,0}$ of six bits into the order of $d_{0,0}$, $d_{3,0}$, $d_{1,0}$, $d_{4,0}$, $d_{2,0}$ and $d_{5,0}$ as seen in FIG. 28 and supplies them as products D101 to the cyclic shift circuit 102. Further, the re-arrangement circuit 101 re-arranges $d_{0,1}$ to $d_{5,1}$ of six bits into the order of $d_{0,1}, d_{3,1}, d_{1,1}, d_{4,1}, d_{2,1}$ and $d_{5,1}$ as seen in FIG. 28 and supplies them as products D101 to the cyclic shift circuit 102.

As seen in FIG. 28, the control section 105 repetitively sets the cyclic shift amount to y×0, y×1, y×2, . . . , y×($n_0-k_0-1$) (mod P) in this order, that is, in the order of 0, 2, 4, 0, and produces and supplies a control signal D106 representative of the amount of cyclic shifting to the cyclic shift circuit 102.

For example, as seen in FIG. 28, the cyclic shift circuit 102 outputs $d_{0,0}, d_{3,0}, d_{1,0}, d_{4,0}, d_{2,0}$ and $d_{5,0}$ supplied thereto as the products D101 of six bits from the re-arrangement circuit 101 as products D102 to the adder 103 without cyclically shifting them. In other words, the cyclic shift amount of $d_{0,0}$ to $d_{5,0}$ is 0.

It is to be noted that re-arrangement and cyclic shifting are performed similarly also for the products D101 of the wth row from above of the vth component matrices from above of the check matrix H' and the first to 11th vectors.

Now, processing of the RAM 104 is described with reference to FIG. 29.

The RAM 104 repeats storage (updating) or reading out of the sums D104 of six bits supplied from the adder 103 based on the control signal D107 from the control section 105, and finally, $o_{0,0}$ to $o_{5,3}$ are stored into the RAM 104 as seen in FIG. 29.

For example, $o_{0,0}$ is stored into the zeroth bit of the zeroth address of the RAM 104-1, and $o_{3,0}$ is stored into the first bit. Further, $o_{1,0}$ is stored into the zeroth bit of the zeroth address of the RAM 104-2, and $o_{4,0}$ is stored into the first bit. Furthermore, $o_{2,0}$ is stored into the zeroth bit of the zeroth address of the RAM 104-3, and $o_{5,0}$ is stored into the first bit.

Further, the RAM 104 reads out $o_{0,0}$ to $o_{5,3}$ stored already therein in order beginning with that which corresponds to the first row of the check matrix H based on the control signal D107 similarly as in the case of FIG. 20 or 25.

In particular, the RAM 104 first reads out $o_{0,0}$ stored in the zeroth bit of the zeroth address of the RAM 104-1 and $o_{0,1}$ stored in the zeroth bit of the first address of the RAM 104-2, and supplies the values as a sum D17 of 2 bits to the accumulator 16.

Then, the RAM 104 reads out $o_{0,2}$ stored in the zeroth bit of the second address of the RAM 104-3 and $o_{0,3}$ stored in the zeroth bit of the third address of the RAM 104-1, and supplies the values as a sum D17 of 2 bits to the accumulator 16.

Then, the RAM 104 reads out $o_{1,0}$ stored in the zeroth bit of the zeroth address of the RAM 104-2 and $o_{1,1}$ stored in the zeroth bit of the first address of the RAM 104-3, and $o_{1,2}$ stored in the zeroth bit of the second address of the RAM 104-1 and $o_{1,3}$ stored in the zeroth bit of the third address of the RAM 104-2 for each two in this order, and supplies the values as sums D17 of two bits to the accumulator 16.

Then, the RAM 104 reads out $o_{2,0}$ stored in the zeroth bit of the zeroth address of the RAM 104-3 and $o_{2,1}$ stored in the zeroth bit of the first address of the RAM 104-1, and $o_{2,2}$ stored in the zeroth bit of the second address of the RAM 104-2 and $o_{2,3}$ stored in the zeroth bit of the third address of the RAM 104-3 for each two in this order, and supplies the values as sums D17 of two bits to the accumulator 16.

Further, the RAM 104 reads out $o_{3,0}$ stored in the first bit of the zeroth address of the RAM 104-1 and $o_{3,1}$ stored in the first bit of the first address of the RAM 104-2, and $o_{3,2}$ stored in the first bit of the second address of the RAM 104-3 and $o_{3,3}$ stored in the first bit of the third address of the RAM 104-1 for each two in this order, and supplies the values as sums D17 of two bits to the accumulator 16.

Then, the RAM 104 reads out $o_{4,0}$ stored in the first bit of the zeroth address of the RAM 104-2 and $o_{4,1}$ stored in the first bit of the first address of the RAM 104-3, and $o_{4,2}$ stored in the first bit of the second address of the RAM 104-1 and $o_{4,3}$ stored in the first bit of the third address of the RAM 104-2 for each two in this order, and supplies the values as sums D17 of two bits to the accumulator 16.

Further, the RAM 104 reads out $o_{5,0}$ stored in the first bit of the zeroth address of the RAM 104-3 and $o_{5,1}$ stored in the first bit of the first address of the RAM 104-1, and $o_{5,2}$ stored in the first bit of the second address of the RAM 104-2 and $o_{5,3}$ stored in the first bit of the third address of the RAM 104-3 for each two in this order, and supplies the values as sums D17 of two bits to the accumulator 16.

As described hereinabove with reference to FIG. 28, since the re-arrangement circuit 101 re-arranges the products D13 and the cyclic shift circuit 102 cyclically shifts the products D101 after the re-arrangement, the sums D104 of two bits read out at the same time by the RAM 104 can be stored into different ones of the RAMS 104-1 to 104-3.

The accumulator 16 uses the sums D17 supplied from the RAM 104 to perform arithmetic operation of the expression (6) as described above, and outputs a parity bit p obtained as a result of the arithmetic operation in a unit of two bits as a parity bit D18 through the selector 17.

As described above, decoding of a codeword c obtained as a result of LDCP coding by the coding apparatus 1 can be carried out in accordance with the algorithm proposed as probabilistic decoding (Probabilistic Decoding) by Gallager, that is, a message passing algorithm (sum product algorithm (Sum Product Algorithm)) according to probability propagation (belief propagation) on a Tanner graph (Tanner graph) which is composed of variable node (variable node (which is also referred to as message node (message node)) and check codes (check code) corresponding to individual rows.

According to this algorithm, if a codeword c of an LDPC code is received, then a message of a check node (real value which represents "0" likelihood of a value in a log likelihood ratio (log likelihood ratio)) is initialized. Thereafter, a process of a check node corresponding to each row and a process of a variable node corresponding to each column are performed repetitively to perform decoding.

Where the syndrome of a value obtained as a result of a process of a variable node is 0, or where processes of a check node and a variable node are repeated by a plural number of times, a value obtained as a result of the process of a variable node at this point of time is outputted as a decoding result. Then, the algorithm is ended.

As described above, in the coding apparatus 1 of FIG. 8, the adder 13 integrates products of an information word D12 of six bits and the information part of a check matrix H corresponding to the information word D12 for each row in a unit of six bits and stores sums D15 obtained by the integration into the RAM 14. Then, the accumulator 16 integrates a sum D17 corresponding to a sum D16 (D15) of two bits read out from the RAM 14 and outputs a parity bit D18 of two bits obtained as a result of the integration as a parity bit p of the codeword c. Therefore, the circuit scale of the coding apparatus can be reduced without changing the operation speed of coding of linear codes.

While, in the present embodiment, the column number k of the information part of the check matrix H is 102 and the row number (or column number) P of the component matrices is six, the column number k of the information part and the row number P of the component matrices are not limited to them. For example, the coding apparatus 1 can be applied also to a check matrix H wherein the information length of the information word i is longer than 102 and the column number k of the information part is great and can be applied also to a check matrix H which can be divided into component matrices which are square matrices of a size greater than 6×6.

Further, while, in the present embodiment, the bit number of the RAM 104 is 2 and the word number is 6 while the number of RAMS is 3, the bit number, word number and RAM number are not limited to them but have a degree of freedom. Further, the bit number of the sums D104 which can be read out at the same time from the RAM 104 or the bit number of the sum D104 which can be written into the RAM 104 may be any number.

While, in the embodiment described above, the LDPC code is two-dimensional, where the LDPC code is not two-dimensional and 1 bit is represented by $\{0, \ldots, q\}$ ($q>1$), also multiplication and division are required for arithmetic operation of a parity bit p by the accumulator 16.

Further, if a barrel shifter is used for the cyclic shift circuits 12 and 102 described hereinabove, then the circuit scale can be reduced.

The present invention can be applied to a case wherein a check matrix for a linear code is represented by a combination of a plurality of component matrices while a unit matrix of P×P, a quasi unit matrix which is a matrix wherein one or more of those components of the unit matrix which are 1 are changed into 0, a shift matrix which is a matrix formed by cyclically shifting the unit matrix or the quasi unit matrix, a sum matrix which is the sum of a plurality of ones of the unit matrix, quasi unit matrix and shift matrix or a 0 matrix of P×P is one of the component matrices.

Further, the effects of the invention increase as the information length of the information word i increases (becomes longer).

Although generally the calculation amount necessary for LDPC coding is small, also in LDPC coding by the coding apparatus 1, where a check matrix H includes a great number of 0 elements, the calculation amount can be reduced significantly.

Further, since the coding apparatus 1 incorporates arithmetic operation of vectors and matrices with fidelity, it does not output different outputs from those of conventional coding apparatus.

While, in the present embodiment, coding into an LDPC code is described, the present invention can be applied to a coding apparatus which performs coding not only into LDPC codes but also into other linear codes.

The coding apparatus 1 described above which codes LDPC codes can be applied, for example, to an apparatus for a broadcasting station which broadcasts a (digital) satellite broadcast and so forth.

The invention claimed is:

1. A coding apparatus for coding predetermined information into a linear code, comprising:
   where a check matrix for the linear code is represented by a combination of a plurality of component matrices while a unit matrix of P×P, a quasi unit matrix which is a matrix wherein one or more of those components of the unit matrix which are 1 are changed into 0, a shift matrix which is a matrix formed by cyclically shifting the unit matrix or the quasi unit matrix, a sum matrix which is the sum of a plurality of ones of the unit matrix, quasi unit matrix and shift matrix or a 0 matrix of P×P is one of the component matrices, or where the check matrix for the linear code is represented by a combination of a plurality of component matrices by permutation of rows and/or columns;
   first integration means for integrating the product of the information and the information part of the check matrix corresponding to the information for each row in a unit of a plurality of rows;
   storage means for storing a first integration value obtained as a result of the integration by said first integration means; and
   second integration means for integrating first integration values read out from said storage means and output a second integration value obtained by the integration as part of the linear code.

2. The coding apparatus according to claim 1, wherein the linear code is an LDPC (Low Density Parity Check) code.

3. The coding apparatus according to claim 1, wherein said first integration means integrates in a unit of a number of rows which is a divisor of the P.

4. The coding apparatus according to claim 3, wherein said storage means is formed from a memory into and from which the number of first integration values which is the divider of the P can be written and read out simultaneously.

5. The coding apparatus according to claim 4, wherein said storage means stores the first integration values such that 1s of the check matrix for the linear code are filled in a column direction.

6. The coding apparatus according to claim 5, wherein said storage means is a RAM (Random Access Memory), whose address corresponds to one of the P rows of the information part of the check matrix.

7. The coding apparatus according to claim 6, further comprising
   arithmetic operation means for arithmetically operating the product of the information and the information part of the check matrix corresponding to the information in a unit of a unit matrix, a quasi unit matrix or a shift matrix, wherein
   said storage means stores the product arithmetically operated by said arithmetic operation means such that the products which are obtained, when the sum matrix in the information part of the check matrix is divided into sums of a plurality of matrices from among the unit matrix, quasi unit matrix and shift matrix, corresponding to the individual ones of the plurality of matrices into the same address, and
   said first integration means adds the product read out from said storage means and the product obtained by said arithmetic operation means to integrate the product for each row in a unit of P rows.

8. The coding apparatus according to claim 3, wherein said first integration means integrates the information successively inputted thereto and the information part of the check matrix corresponding to the information and successively outputs the first integration values successively obtained by the integration to said second integration means through said storage means, and
   said second integration means integrates the first integration values successively inputted thereto from said first integration means through said storage means and successively outputs the second integration values successively obtained by the integration.

9. The coding apparatus according to claim 8, further comprising
   re-arrangement means for cyclically shifting the information to calculate the product.

10. The coding apparatus according to claim 8, wherein
said first integration means includes a number of third integration means equal to a divisor of the P for integrating the product for each row, and the number of third integration means equal to the number of a divisor of the P integrate the products simultaneously for the individual rows.

11. The coding apparatus according to claim 8, wherein
said second integration means adds the first integration value read out from said storage means and the second integration value obtained as a result of the addition in the preceding addition cycle and outputs the addition value obtained by the addition as the second integration value and besides uses the addition value for addition in a next addition cycle.

12. The coding apparatus according to claim 8, further comprising
order control means for controlling the order of the first integration values obtained by the integration by said first integration means, wherein said storage means stores the first integration values whose order is controlled by said order control means.

13. The coding apparatus according to claim 12, wherein
said order control means performs re-arrangement and cyclic shifting of the first integration values to control the order of the first integration values.

14. The coding apparatus according to claim 12, wherein
said storage means is formed from a plurality of memories which allow simultaneous reading and writing of the number of first integration values equal to a divisor of the P and which can be controlled independently of each other.

15. The coding apparatus according to claim 8, further comprising
order control means for controlling the order of the first integration values read out from said storage means, wherein said second arithmetic operation means stores the first integration values whose order is controlled by said order control means.

16. The coding apparatus according to claim 15, wherein
said order control means is an interleaver.

17. The coding apparatus according to claim 8, further comprising
re-arrangement means for cyclically shifting the P pieces of information to calculate the product.

18. The coding apparatus according to claim 17, wherein
said re-arrangement means is formed from a barrel shifter.

19. A coding method for a coding apparatus which includes storage means for storing a predetermined value and codes predetermined information into a linear code, comprising:
where a check matrix for the linear code is represented by a combination of a plurality of component matrices while a unit matrix of P×P, a quasi unit matrix which is a matrix wherein one or more of those components of the unit matrix which are 1 are changed into 0, a shift matrix which is a matrix formed by cyclically shifting the unit matrix or the quasi unit matrix, a sum matrix which is the sum of a plurality of ones of the unit matrix, quasi unit matrix and shift matrix or a 0 matrix of P×P is one of the component matrices, or where the check matrix for the linear code is represented by a combination of a plurality of component matrices by permutation of rows and/or columns;

a first integration step of integrating the product of the information and the information part of the check matrix corresponding to the information for each row in a unit of a plurality of rows;

a storage control step of causing a first integration value obtained as a result of the integration by the process at the first integration step to be stored into said storage means; and a second integration step of integrating first integration values read out from said storage means and outputting a second integration value obtained by the integration as part of the linear code.

* * * * *